United States Patent
Choi et al.

(10) Patent No.: US 8,901,663 B2
(45) Date of Patent: Dec. 2, 2014

(54) SEMICONDUCTOR DEVICES HAVING PASSIVE ELEMENT IN RECESSED PORTION OF DEVICE ISOLATION PATTERN AND METHODS OF FABRICATING THE SAME

(75) Inventors: Sukhun Choi, Suwon-si (KR); Boun Yoon, Seoul (KR); Injoon Yeo, Hwaseong-si (KR); Jeongnam Han, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 533 days.

(21) Appl. No.: 12/978,669

(22) Filed: Dec. 27, 2010

(65) Prior Publication Data

US 2012/0043614 A1 Feb. 23, 2012

(30) Foreign Application Priority Data

Aug. 20, 2010 (KR) .................. 10-2010-0080955

(51) Int. Cl.
*H01L 27/06* (2006.01)
*H01L 21/82* (2006.01)
*H01L 21/28* (2006.01)
*H01L 49/02* (2006.01)
*H01L 21/8238* (2006.01)

(52) U.S. Cl.
CPC ... *H01L 21/28008* (2013.01); *H01L 21/823814* (2013.01); *H01L 27/0629* (2013.01); *H01L 28/20* (2013.01); *H01L 21/823807* (2013.01)
USPC .......................................... 257/369; 438/382

(58) Field of Classification Search
USPC ............ 257/369, E27.016, E21.602; 438/382
See application file for complete search history.

(56) References Cited

U.S. PATENT DOCUMENTS

| 2010/0019328 | A1  | 1/2010  | Zhang et al. |
| 2010/0019344 | A1* | 1/2010  | Chuang et al. ............... 257/516 |
| 2010/0102399 | A1* | 4/2010  | Hyun et al. .................... 257/402 |
| 2011/0156162 | A1* | 6/2011  | Richter et al. ................ 257/379 |
| 2011/0298085 | A1* | 12/2011 | Terletzki ....................... 257/516 |
| 2011/0318897 | A1* | 12/2011 | Shang et al. .................. 438/382 |

FOREIGN PATENT DOCUMENTS

| JP | 2008-235798 | 10/2008 |
| KR | 102009072323 A | 7/2009 |

* cited by examiner

*Primary Examiner* — Whitney T Moore
(74) *Attorney, Agent, or Firm* — Volentine & Whitt, PLLC

(57) ABSTRACT

A semiconductor device includes a substrate, a device isolation pattern and a passive circuit element. The device isolation pattern is located on the substrate, delimits an active region of the substrate, and includes a recessed portion having a bottom surface located below a plane coincident with a surface of the active region. The passive circuit element is situated in the recess so as to be disposed on the bottom surface of the recessed portion of the device isolation pattern.

18 Claims, 37 Drawing Sheets

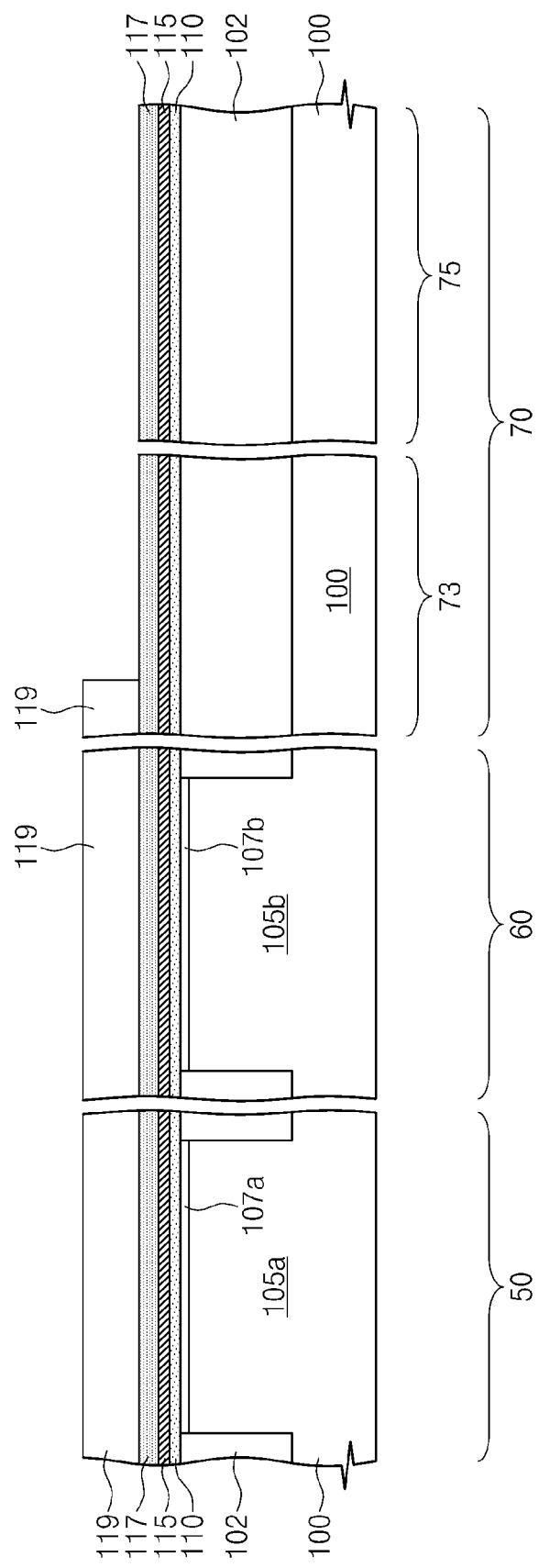

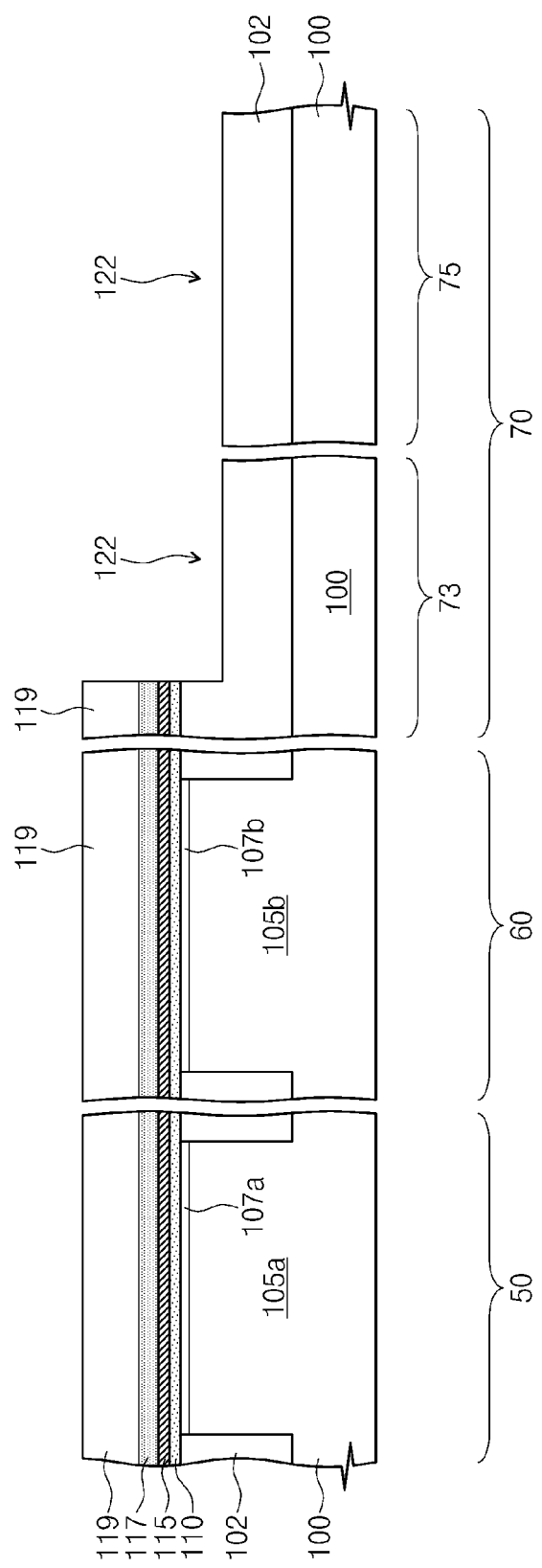

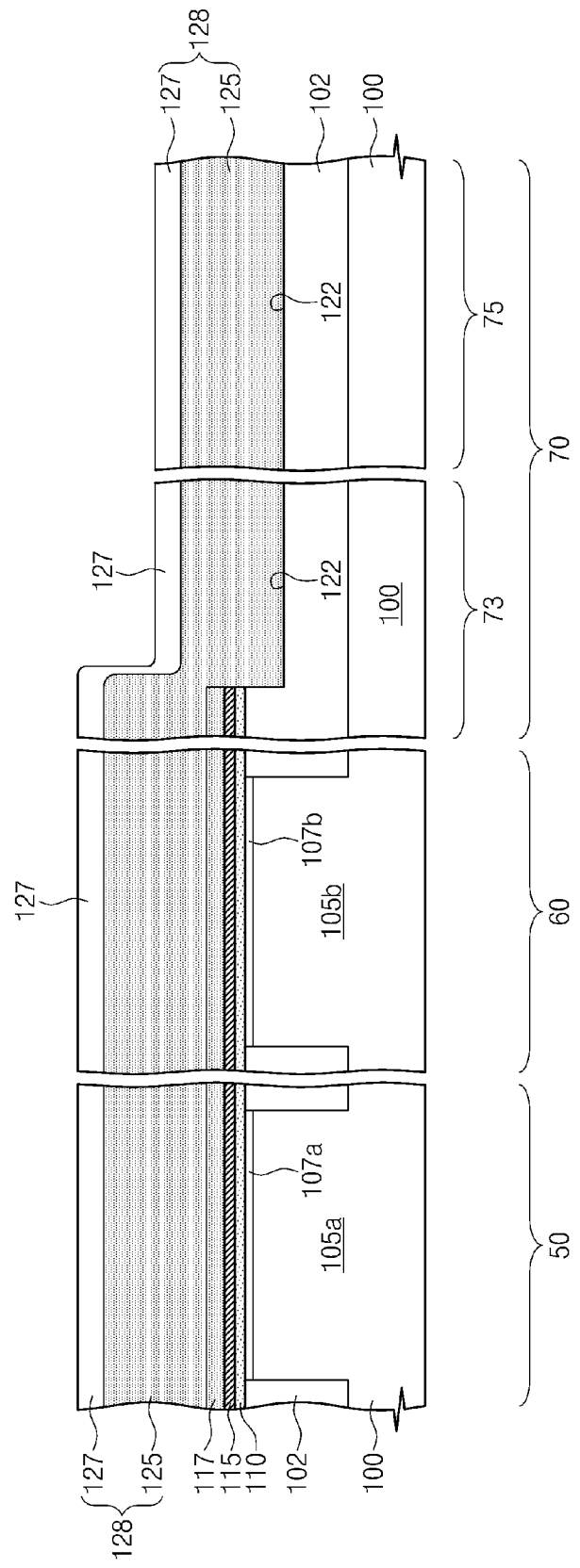

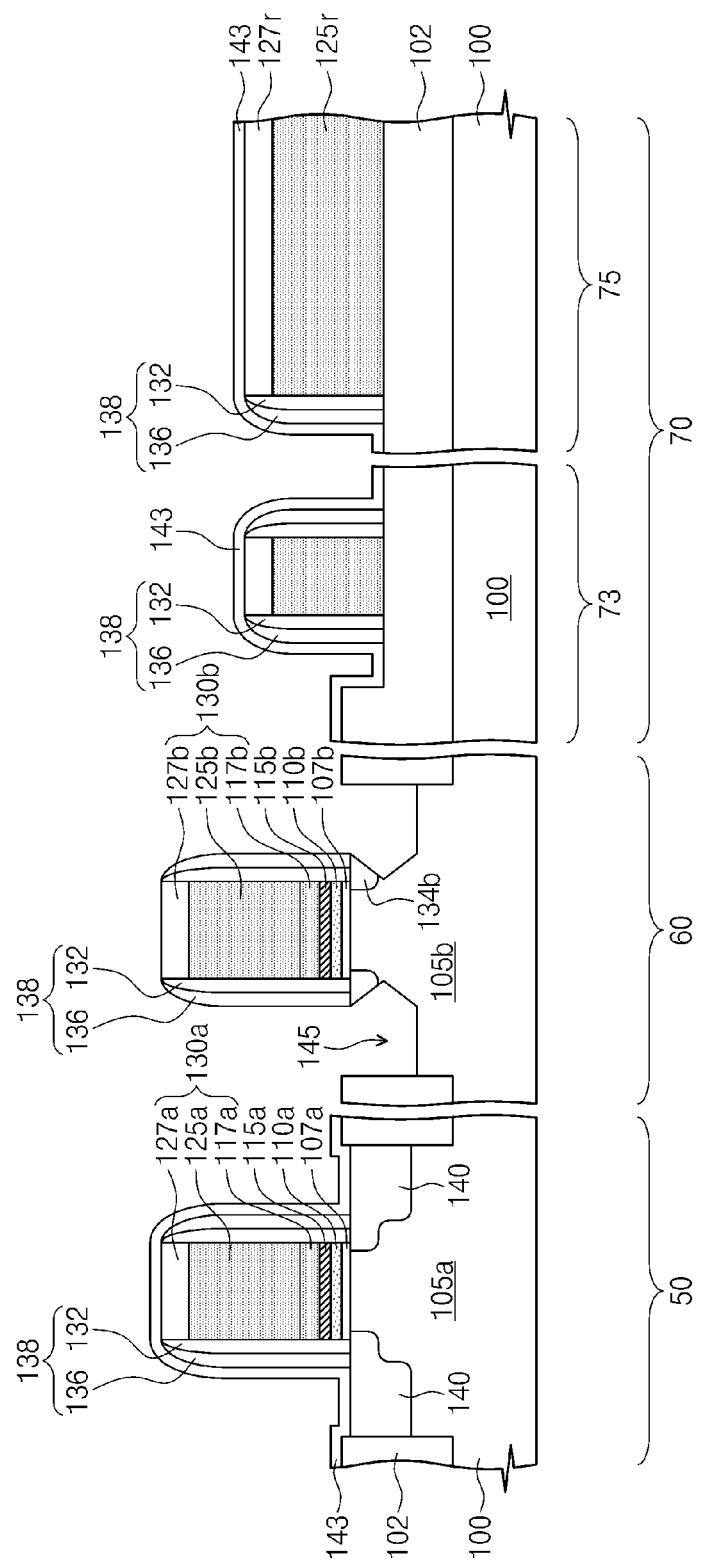

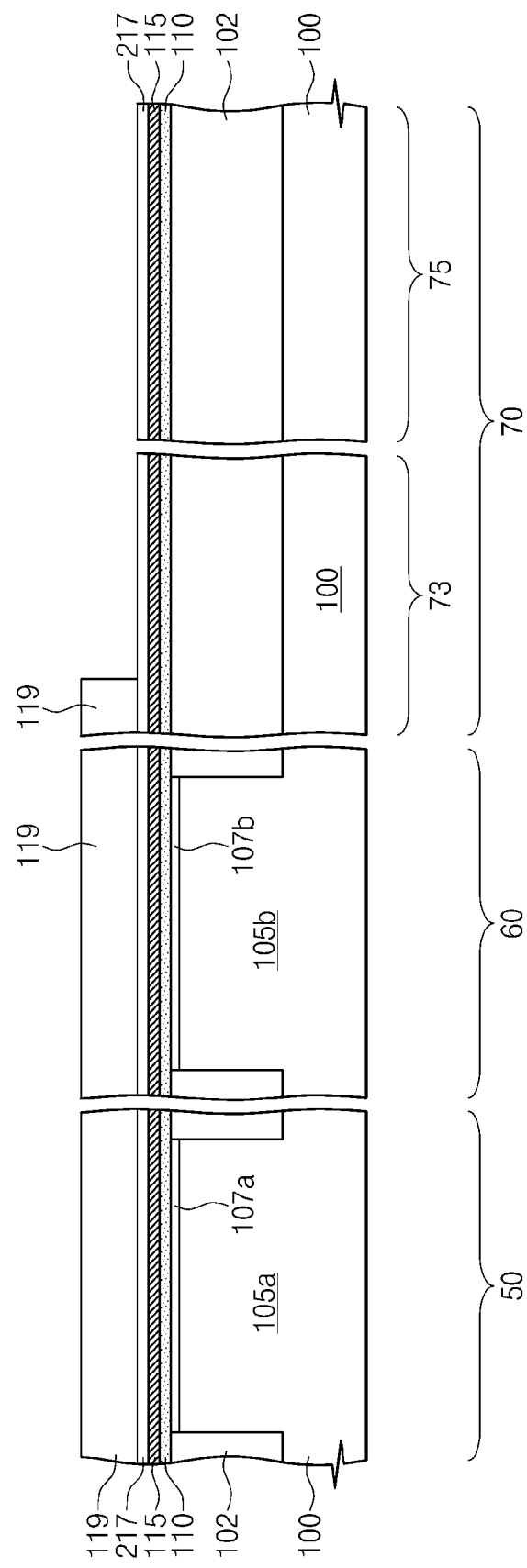

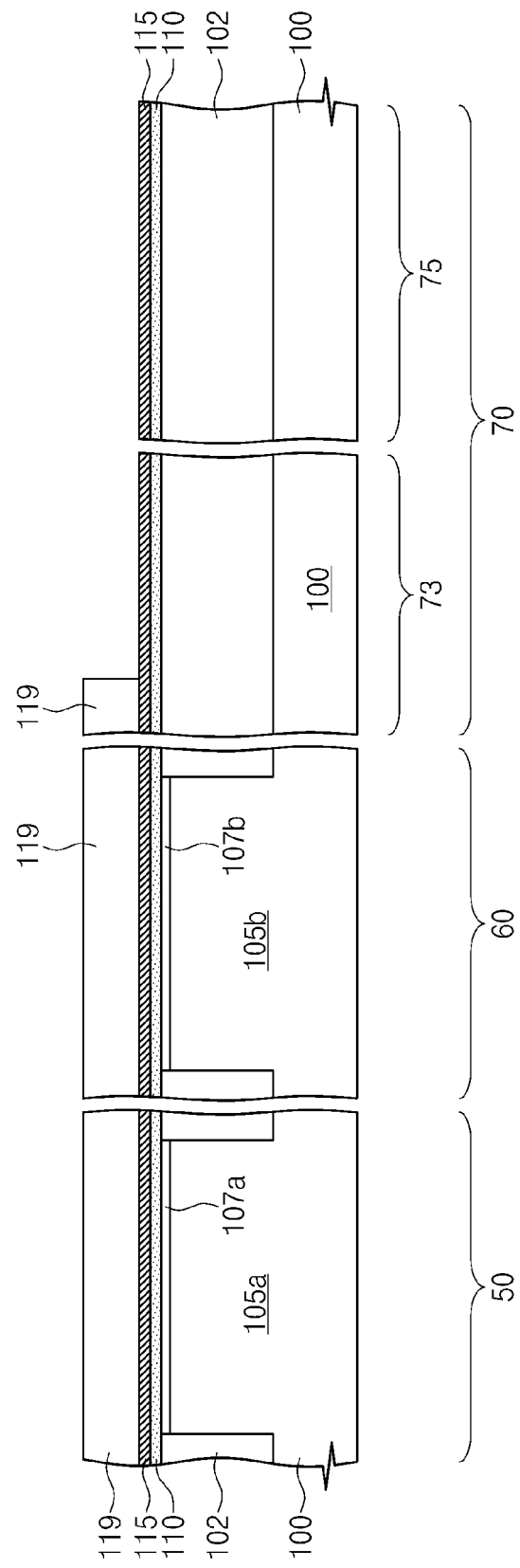

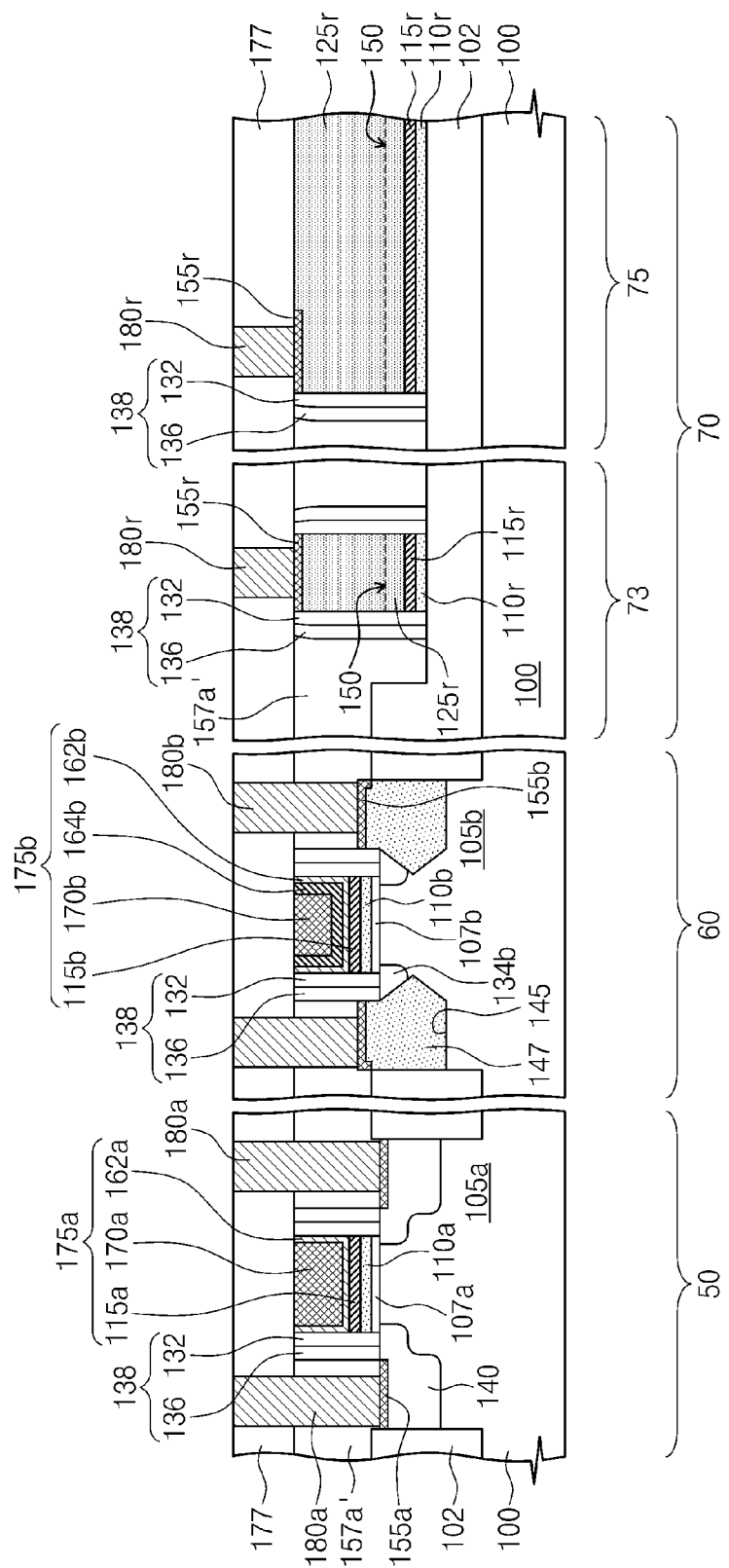

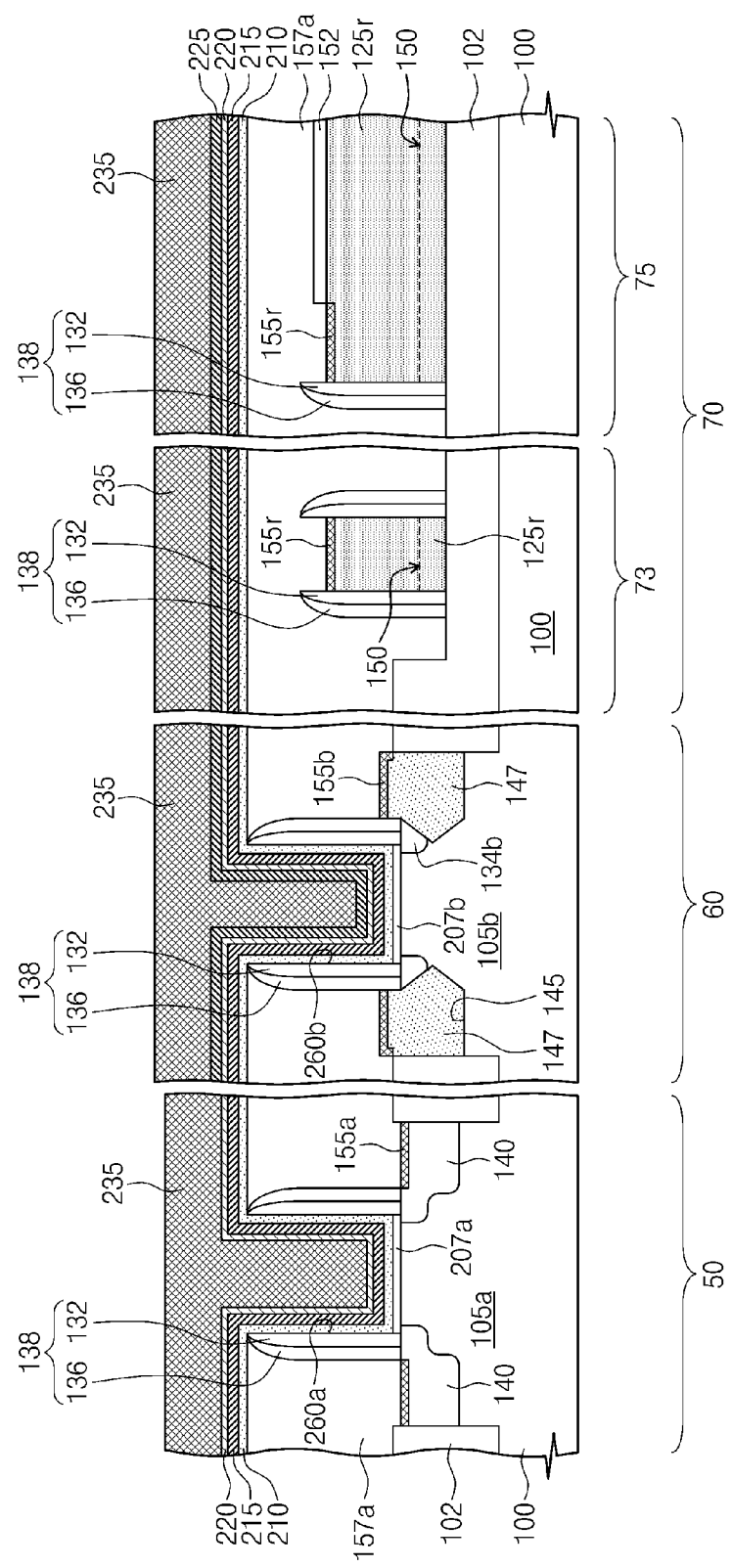

SEMICONDUCTOR DEVICES HAVING PASSIVE ELEMENT IN RECESSED PORTION OF DEVICE ISOLATION PATTERN AND METHODS OF FABRICATING THE SAME

CROSS-REFERENCE TO RELATED APPLICATION

A claim of priority under 35 U.S.C. §119 is made to Korean patent application no. 10-2010-0080955, filed Aug. 20, 2010, the disclosure of which is incorporated herein by reference in its entirety.

BACKGROUND

The inventive concepts relate to semiconductor devices and to methods of fabricating the same. More particularly, the inventive concepts relate to semiconductor devices that include both active and passive electronic components, and to a method of fabricating the same.

Semiconductor devices have been crucial to the development of modern day electronics, especially consumer electronics, due to characteristics such as their miniaturization, multi-functionality, and/or low production costs. With regard to such electronics, semiconductor devices may be classified as: semiconductor memory devices for storing logic data, semiconductor logic devices for processing logic data, and hybrid semiconductor devices which include both a semiconductor memory device and a semiconductor logic device. As electronics continue to evolve, greater demands are placed on improving the characteristics of semiconductor devices. For example, semiconductor devices must have increased reliability, speed and/or multi-functionality to meet a demand for more complex electronics. In order to satisfy these requirements, structures in the semiconductor devices need to be more intricate, a greater number of components need to be employed, and the semiconductor devices also need to be more highly integrated. Accordingly, fabricating the semiconductor devices required of today's electronics is becoming more and more difficult.

SUMMARY

According to an aspect of the inventive concepts, a semiconductor device is provided which includes a substrate, a device isolation pattern and a passive circuit element. The device isolation pattern is located on the substrate, delimits an active region of the substrate, and includes a recessed portion having a bottom surface located below a plane coincident with a surface of the active region. The passive circuit element is situated in the recess so as to be disposed on the bottom surface of the recessed portion of the device isolation pattern.

According to another aspect of the inventive concepts, a method of fabricating a semiconductor device is provided which include forming a device isolation pattern on a substrate, where the device isolation pattern delimits an active region of the substrate, and forming a recess in an upper surface of the device isolation pattern such that a bottom surface of the recess is located below a plane coincident with an upper surface of the active region. The method further includes forming a passive circuit element on the bottom surface of the recess in the device isolation pattern.

According to still another aspect of the inventive concepts, a method of fabricating a semiconductor device is provided which includes forming a device isolation pattern in regions of a substrate corresponding to a first region and a passive element region of the substrate, where the device isolation pattern delimits an active region of the substrate within the first region. The method further includes forming a recess in an upper surface of the device isolation pattern in the passive element region to such a depth that a bottom surface of the recess is located below a plane coincident with an upper surface of the active region, and forming a contiguous dummy layer that extends on the active region and on the bottom surface of the recess of the device isolation pattern. The method further includes forming both a dummy pattern on the active region and a passive circuit element on the bottom surface of the recess, wherein the forming of both the dummy pattern and the passive circuit element comprises patterning the dummy layer to leave portions thereof on the active region and on the passive element region, respectively. The method further includes forming an interlayer dielectric layer on the substrate, where the interlayer dielectric layer has a planar upper surface substantially coplanar with the upper surface of the dummy pattern and which is disposed above the passive circuit element in the passive element region. The method further includes removing the dummy pattern to form an opening through the interlayer dielectric layer that exposes part of the active region while the planar upper surface of the interlayer dielectric layer remains disposed above the passive circuit element in the passive element region, and forming a gate electrode in the opening.

BRIEF DESCRIPTION OF THE DRAWINGS

The above and other aspects and features of the inventive concepts will become readily apparent from the detailed description that follows, with reference to the accompanying drawings, in which:

FIGS. 3A through 3D are sectional views illustrating process in another example of the first embodiment of a method of fabricating a semiconductor device according to the inventive concepts;

FIGS. 4A and 4B are sectional views illustrating another modification of a method of fabricating a semiconductor device according to an embodiment of the inventive concepts;

FIG. 5B is a sectional view of another example of the second embodiment of a semiconductor device according to the inventive concepts;

FIGS. 8A through 8F are sectional views illustrating a third embodiment of a method of fabricating a semiconductor device according to the inventive concepts.

DETAILED DESCRIPTION OF EMBODIMENTS

Figure 1A:
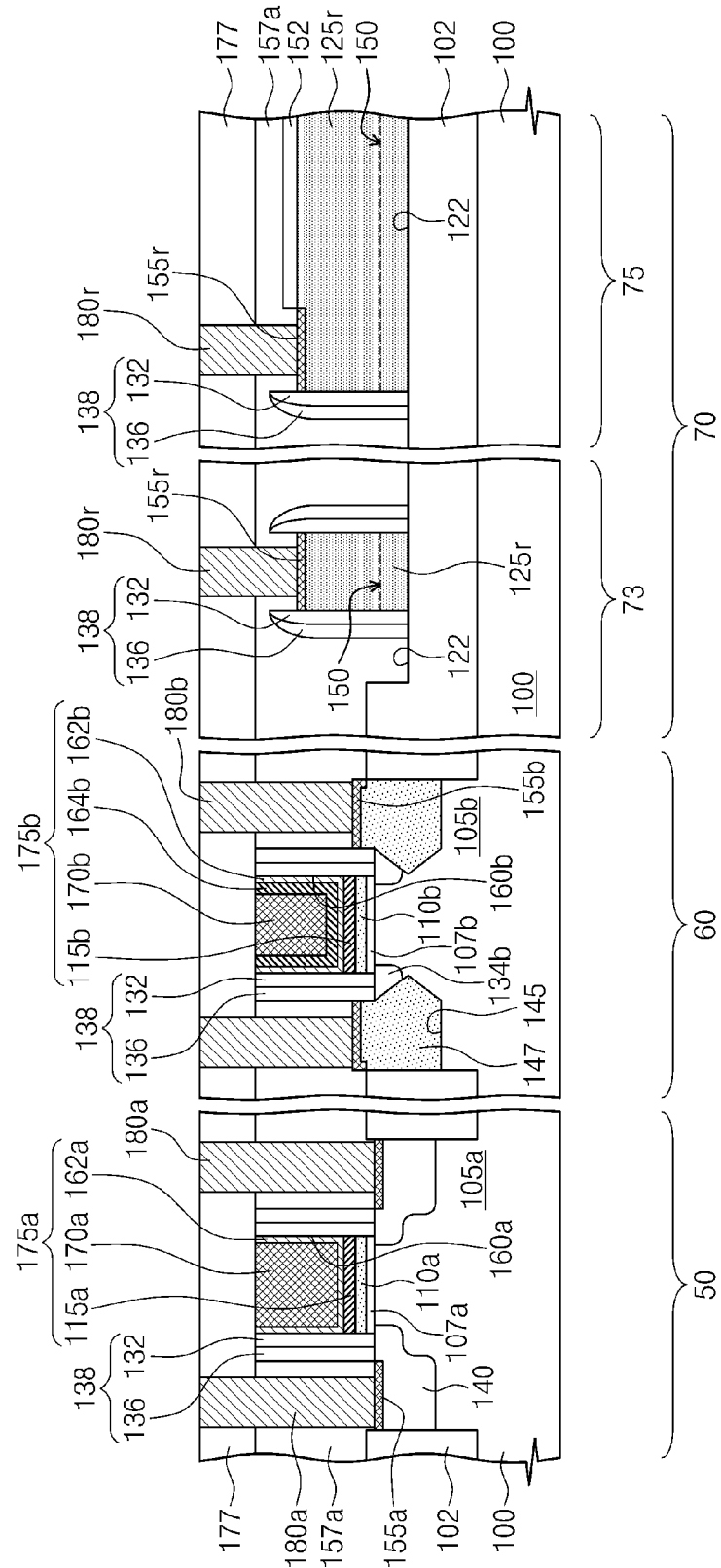
FIG. 1A is a sectional view of one example of a first embodiment of a semiconductor device according to the inventive concepts.

Various embodiments and examples of embodiments of the inventive concepts will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, when like numerals appear in the drawings, such numerals are used to designate like elements.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concepts can assume orientations different than those illustrated in the drawings when in use. In addition, the terms "upper" or "bottom" as used to describe a surface generally refer not only to the orientation depicted in the drawings but to the fact that the surface is the uppermost or bottommost surface in the orientation depicted, as would be clear from the drawings and context of the written description.

It will also be understood that when an element or layer is referred to as being "on" another element or layer, it can be directly on the other element or layer or intervening elements or layers may be present. In contrast, when an element or layer is referred to as being "directly on" another element or layer, there are no intervening elements or layers present.

Furthermore, the term "and/or" as used herein includes any and all practical combinations of one or more of the associated listed items. With respect to materials of a particular layer, the term "and/or" may be used to indicate that the particular layer is made up of one or more films of different materials.

It will also be understood that although the terms first, second, third, etc. are used herein to describe various elements, regions, layers, etc., these elements, regions, and/or layers are not limited by these terms. These terms are only used to distinguish one element, layer or region from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A first embodiment of a semiconductor device according to the inventive concepts will now be described with reference to FIG. 1A.

The semiconductor device of this example includes a cell or transistor region and a passive electronic component region. In an example of this embodiment, the semiconductor device has a first transistor region 50, a second transistor region 60, and a passive element region 70. The first transistor region 50 is a region at which a first field effect transistor (hereinafter, referred to as a first transistor) is disposed, the second transistor region 60 is a region at which a second field effect transistor (hereinafter, referred to as a second transistor) is disposed, and the passive element region 70 is a region at which a passive element is disposed.

To this end, the semiconductor device includes a semiconductor substrate 100 having regions corresponding to the cell or transistor region and the passive electronic component region. Thus, in this example, the semiconductor substrate 100 has regions corresponding to the first transistor region 50, second transistor region 60, and passive element region 70 of the device.

The substrate 100 may, as examples, be a silicon substrate, a germanium substrate, or a silicon-germanium substrate. A device isolation pattern 102 is provided at the upper portion of the substrate 100. The device isolation pattern 102 defines active regions of the substrate 100 in the cell or transistor region and is also be present in the passive element region 70. The device isolation pattern 102 may be of an oxide. In this example, the device isolation pattern 102 establishes a first active region 105a in the first transistor region 50 and a second active region 105b in the second transistor region 60. In particular, the first active region 105a is a portion of the substrate 100 surrounded by the device isolation pattern 102 in the first transistor region 50, and the second active region 105b is a portion of the substrate 100 surrounded by the device isolation pattern 102 in the second transistor region 60. The first active region 105a may include a first conductive dopant and the second active region 105b may include a second conductive dopant.

At least one active electronic component is disposed in the active region(s) of the device. In this example, a first gate electrode 175a is disposed on the first active region 105a and a first gate dielectric pattern (107a and 110a) is interposed between the first gate electrode 175a and the first active region 105a. A second gate electrode 175b is disposed on the second active region 105b and a second gate dielectric pattern (107b and 110b) is interposed between the second gate electrode 175b and the second active region 105b. The active electronic components will be described in more detail later herein.

A passive electronic component (referred to hereinafter as a "passive element") sits in a recess in an upper portion of the device isolation pattern 102 in the passive element region 70. In this example, the passive element comprises a passive element pattern 125r disposed on a bottom surface of a recessed portion 122 of the device isolation pattern 102 in the passive element region 70. In this regard, the passive element pattern 125r may, for example, be disposed directly on the bottom surface of the recessed portion 122.

The bottom surface of the recessed portion 122 is disposed at a level beneath the level of the upper surface of each of the first and second active regions 105a and 105b of the substrate 100. In this example, the bottom surface of the passive element pattern 125r lies in a plane beneath a plane coincident with the upper surfaces of each of the first and second active regions 105a and 105b. Also, in this example, the bottom surface of the passive element pattern 125r is disposed at a level beneath the level of the bottom surfaces of the first and second gate electrodes 175a and 175b.

Before the description of the semiconductor device proceeds any further, FIG. 1A will be explained in more detail. In FIG. 1A, the first transistor region 50 of the device is shown in section as taken in a direction perpendicular to the longitudinal direction of the of the first gate electrode 175a. That is, the sectional view of the first transistor region 50 is along the length-wise direction of the channel of the first transistor (the region of the substrate below the first gate electrode 175a). Likewise, the second transistor region 60 of the device is shown in section as taken in a direction perpendicular to the longitudinal direction of the of the second gate electrode 175b, i.e., the sectional view of the second transistor region 60 is along the length-wise direction of the channel of the second transistor (the region of the substrate below the second gate electrode 175b). In FIG. 1A, reference numeral 73 designates the passive element region 70 as shown in section in a direction perpendicular to the longitudinal direction of the passive element pattern 125r, whereas reference numeral 75 designates the same passive element region 70 but shown in section in the longitudinal direction of the passive element pattern 125r.

Referring once again to the passive element region 70, the passive element pattern 125r of this example is a resistor of an integrated circuit. Accordingly, the passive element region 70 may be a resistor-region at which a semiconductor integrated circuit comprising the resistor is disposed. Alternatively, the passive element region 70 may be an e-fuse circuit region at which an e-fuse circuit comprising the resistor is disposed. However, the inventive concepts are not limited to the passive element being a resistor and/or e-fuse.

Furthermore, the passive element pattern 125r may comprise a semiconductor material. For example, the passive element pattern 125r may comprise silicon, germanium, or silicon-germanium. In one example, the passive element pattern 125r comprises semiconductor material in a polycrystalline state. The passive element pattern 125r may be doped with an n type-dopant or a p type-dopant to provide the passive element pattern 125r with a desired resistivity. In this respect, the entire passive element pattern 125r may be substantially uniformly doped. Alternatively, as shown in the figure, only an upper portion of the passive element pattern 125r may be doped, and the lower portion of the passive element pattern 125r remains undoped. Reference numeral 150 designates the boundary between the doped and undoped portions of the passive element pattern 125r.

In the example of this embodiment, the first gate dielectric pattern includes a first pattern 110a of a high-k dielectric interposed between the first gate electrode 175a and the first active portion 105a. Such a pattern will be referred to hereinafter as high-k dielectric pattern. Furthermore, the first gate electric pattern also includes a first interfacial layer 107a interposed between the first high-k dielectric pattern 110a and the first active portion 105a. Similarly, the second gate dielectric pattern includes a second high-k dielectric pattern 110b interposed between the second gate electrode 175b and the second active portion 105b. Furthermore, the second gate electric pattern also includes a second interfacial layer 107b interposed between the second high-k dielectric pattern 110b and the second active portion 105b. The first and second interfacial layers 107a and 107b may each comprise an oxide. Also, the first and second interfacial layers 107a and 107b may have substantially the same thickness, as shown in the figure. Alternatively, the first and second interfacial layers 107a and 107b may have different thicknesses. The high-k dielectric material, as is understood in the art, is dielectric material having a dielectric constant greater than that of silicon oxide. For example, the first and second high-k dielectric patterns 110a and 110b may be of one or more metal oxides such as hafnium oxide and aluminum oxide. Thus, each of the first and second high-k dielectric patterns 110a and 110b may be single-layered or multi-layered As is clear from the description above, the first gate electrode 175a is part of a first transistor and the second gate electrode 175b is part of a second transistor. The work function of at least a portion of the first gate electrode 175a adjacent to the first gate dielectric pattern (107a and 110a) may be different from that of at least a portion of the second gate electrode 175b adjacent to the second gate dielectric patterns 107b and 110b. In this regard, one of the first and second transistors may be an NMOS transistor and the other may be a PMOS transistor. If the first transistor is an NMOS transistor and the second transistor is a PMOS transistor, the work function of the first gate electrode 175a may be closer to the conduction band maximum of the semiconductor material in the substrate 100 than the work function of the second gate electrode 175b. On the contrary, if the second transistor is an NMOS transistor and the first transistor is a PMOS transistor, the work function of the second gate electrode 175b may be closer to the conduction band maximum of the semiconductor material of the substrate 100 than the work function of the first gate electrode 175a.

Working examples of first and second gate electrodes 175a and 175b having different work functions will be described in more detail below. However, the first and second gate electrodes 175a and 175b can be provided with different work functions through combinations of layers, materials, etc. other than those described below.

The first gate electrode 175a may include a first metal-containing pattern 115a, a first etching barrier conductive pattern 162a, and a first metal pattern 170a which are stacked one atop the other in the foregoing order. The second gate electrode 175b may include a second metal-containing pattern 115b, a second etching barrier conductive pattern 162b, a diffusion barrier conductive pattern 164b, and a second metal pattern 170b which are stacked one atop the other in the foregoing order. In this example, the second metal-containing pattern 115b comprises a conductive metal nitride. Furthermore, the first metal-containing pattern 115a may be of the same elements as the second metal-containing pattern 115b and may additionally include the same type of metal as the first metal pattern 170a. As will be clear from the description of the method shown in FIGS. 2A-2N, metal in the first metal pattern 170a diffuses into the first metal-containing pattern 115a, such that the first metal-containing pattern 115a acquires a composition containing the same type of metal as the first metal pattern 170a. In such a structure, the first metal-containing pattern 115a and the second metal-containing pattern 115b have different work functions.

The first metal pattern 170a may comprise metal having a resistivity lower than that of the first metal-containing pattern 115a. Furthermore, the first metal pattern 170a may comprise metal having a work function different from that of the second metal-containing pattern 115b. For example, if the substrate 100 is a silicon substrate and the first transistor is an NMOS transistor and the second transistor is a PMOS transistor, the second metal-containing pattern 115b may include titanium nitride and the first metal pattern 170a may comprise aluminum. The first metal containing pattern 115a may include nitrogen, titanium and aluminum. Accordingly, the work function of the first metal-containing pattern 115a is closer to the conduction band maximum of silicon than the work function of the second metal-containing pattern 115b, and the work function of the second metal-containing pattern 115b is closer to the valence band maximum of silicon than the work function of the first metal-containing pattern 115a.

The second etching barrier conductive pattern 162b may include a conductive metal nitride having an etch selectivity with respect to the diffusion barrier conductive pattern 164b. For example, the diffusion barrier conductive pattern 164b may include titanium nitride and the second etching barrier conductive pattern 162b may include tantalum nitride. The diffusion barrier conductive pattern 164b may further include the same type of metal as the second metal pattern 170b (as the result of the diffusion of metal from the second metal pattern 170b during the manufacturing process). The first etching barrier conductive pattern 162a may be of the same type of material as the second etching barrier conductive pattern 162b. Furthermore, the first etching barrier conductive pattern 162a may also include the same type of metal as the first metal pattern 170a (again, as the result of the diffusion of metal from the first metal pattern 170a during the manufacturing process). The second metal pattern 170b may be of metal having a resistivity lower than the resistivity of the second metal-containing pattern 115a. Furthermore, the first and second metal patterns 170a and 170b may be of the same metal. Thus, in this example, the second metal pattern 170b comprises aluminum.

Each of the first and second metal patterns 170a and 170b may also include an adhesive layer. In this case, the adhesive layer of the first metal pattern 170a contacts the first etching barrier conductive pattern 162a and the adhesive layer of the second metal pattern 170b contacts the diffusion barrier conductive pattern 164b. The adhesive layers may be layers that include titanium.

Referring once again to the general structure of the semiconductor device according to an example of the first embodiment, a first interlayer dielectric layer 157a having a planar upper surface is disposed on the substrate 100. A first opening 160a is defined in the first interlayer dielectric layer 157a in the first transistor region 50, and a second opening 160b is defined in the first interlayer dielectric layer 157a in the second transistor region 60. The first opening 160a has an elongated shape, i.e., is in the form of a groove, and extends across the first active region 105a. The second opening 160b also has the form of a groove and extends across the second active region 105b. The first gate dielectric pattern and the first gate electrode 175a occupy the first opening 160a and the second gate dielectric pattern and the second gate electrode 175b occupy the second opening 160b.

In this embodiment, upper surfaces of the first and second gate electrodes 17a and 175b are substantially coplanar with the upper surface of the first interlayer dielectric layer 157a. Furthermore, the upper surface of the first interlayer dielectric layer 157a is disposed above the upper surface of the passive element pattern 125r in the passive element region 70. Accordingly, the first interlayer dielectric layer 157a covers the passive element pattern 125r in the passive element region 70.

Insulation spacers 138 may be disposed between the first interlayer dielectric layer 157a and the sidewalls of the first gate electrode 175a, respectively, and between the first interlayer dielectric layer 157a and the sidewalls of the second gate electrode 175b, respectively. Furthermore, an insulation spacer 138 may be disposed on the sidewall of the passive element pattern 125r. Each insulation spacer 138 may include a first spacer layer 132 disposed along the sidewall of the respective electrode/element with which it is associated, and a second spacer layer 136 disposed between the first spacer element 136 and the first dielectric layer 157a. In any case, the upper ends of the insulation spacers 138 disposed on the sidewalls of the first and second gate electrodes 175a and 175b are substantially coplanar with the upper surfaces of the first and second gate electrodes 175a and 175b. On the other hand, the upper end of the insulation spacer 138 on the sidewall of the passive element pattern 125r is disposed above the level of the upper surface of the passive element pattern 125r.

Also, in this case, the first opening 160a is defined by a sidewall (inner) of the spacer 138 that contacts the sidewall of the first gate electrode 175a, and the second opening 160b is defined by a sidewall (inner) of the spacer 138 that contacts the sidewall of the second gate electrode 175b. However, in the case in which the insulation spacers 138 are omitted, the first and second openings 160a and 160b defined by inner surfaces of the first interlayer dielectric layer 157a.

Referring still to FIG. 1A, in this example of the first embodiment of a semiconductor device according to the inventive concept, the first high-k dielectric pattern 110a is self-aligned with the first gate electrode 175a. More specifically, the first high-k dielectric pattern 110a is generally planar and is interposed between the first gate electrode 175a and the first active portion 105a. Opposite sides of the first etching barrier conductive pattern 162a each extend upward and respectively cover the sidewalls of the first metal pattern 170a. The side edges of the first high-k dielectric pattern 110a are vertically aligned, respectively, with the outer surfaces of the upwardly extending sides of the first etching barrier conductive pattern 162a. Also, the sides of first metal-containing pattern 115a are respectively aligned with the side edges of the first high dielectric pattern 110a. That is, the sides of the first metal-containing pattern 115a are vertically aligned, respectively, with the outer surfaces of the upwardly extending sides of the first etching barrier conductive pattern 162a.

The second high-k dielectric pattern 110b is similarly self-aligned with the second gate electrode 175b.

The first gate electrode 175a has a height from the upper surface of the first metal-containing pattern 115a to the upper surface of the first metal pattern 170a, the second gate electrode 175b has a height from the upper surface of the second metal-containing pattern 115b to the upper surface of the second metal pattern 170b, and the passive element pattern 125r has a height from its bottom surface to its upper surface. In an example of the first embodiment of a semiconductor device according to the inventive concept, the height of the first gate electrode 175a may be substantially the same as the height of the second gate electrode 175b. Furthermore, the height of the passive element pattern 125b may be substantially the same as or greater than the height of each of the first and second gate electrodes 175a and 175b. In the example of FIG. 1A, the height of the passive element pattern 125b is substantially the same as the height of each of the first and second gate electrodes 175a and 175b.

The first active region 105a includes a first source/drain region 140 at the sides of the first gate electrode 175a. The second active region 105b includes a second source/drain region (147 and 134b) at the sides of the second gate electrode 175b. The first source/drain region 140 is a region of the substrate 100 that includes the second conductive dopant and the second source/drain region (147 and 134b) is a region of the substrate 100 that includes the first conductive dopant.

In the illustrated example of the first embodiment in which the first transistor is an NMOS transistor and the second transistor is a PMOS transistor, the first conductive dopant is a p-type dopant and the second conductive dopant is an n-type dopant. In this case, the first source/drain region 140 may have a first source/drain extension disposed below the insulation spacer 138 on the sidewall of the first gate electrode 175a, and a high concentration region. The second source/drain region (147 and 134b) may include a second source/drain extension 134b disposed below the insulation spacer 138 on the sidewall of the second gate electrode 175b, and a stress pattern 147. The stress pattern 147 fills a recess 145 in the second active region 105b at the both sides of the second gate electrode 175b. The stress pattern 147 comprises semiconductor material of a type different from that of the semiconductor material of the substrate 100.

The purpose of the stress pattern 147 is to induce stress in the channel region (region of the substrate 100 located below the second gate electrode 175b). For example, the stress pattern 147 exerts a compressive force on the channel region.

The induced stress increases the mobility of the charge carriers (holes) in the channel of the PMOS transistor. In order to exert a compressive force on the channel region, the stress pattern 147 may comprise material having an atomic diameter greater than that of the material of the substrate 100. For example, if the substrate 100 is a silicon substrate, the stress pattern 147 may be of silicon-germanium. Additionally, the stress pattern 147 may be doped with a p-type dopant. The stress pattern 147 may also have a higher concentration of dopant than the second source/drain extension part 134b. Still further, the upper surface of the stress pattern 147 may be disposed at a level higher than that of the upper surface of the second active region 105b.

Referring once again to the example shown in FIG. 1A, the semiconductor device may include a first surface metal-semiconductor compound pattern 155a on the upper surface of the first source/drain region 140, and a second surface metal-semiconductor compound pattern 155b on the upper surface of the second source/drain region. In the case in which the insulation spacers 138 are provided, the first surface metal-semiconductor compound pattern 155a is laterally spaced from the first gate electrode 175a by the insulation spacer 138 that covers the sides of the first gate electrode 175a. Likewise, the second surface metal-semiconductor compound pattern 155b is laterally spaced from the second gate electrode 175b by the insulation spacer 138 that covers the sides of the second gate electrode 175b. If the substrate 100 is a silicon substrate, the first surface metal-semiconductor compound pattern 155a may be a metal silicide. If the stress pattern 147 is provided, the second surface metal-semiconductor compound pattern 155b is formed on the stress pattern 147. In the case in which the stress pattern 147 is formed of silicon-germanium, the second surface metal-semiconductor compound pattern 155b may be formed of a metal-silicon-germanium compound.

The semiconductor device may also have a contact metal-semiconductor compound pattern 155r disposed on the upper surface of the passive element pattern 125r. If the passive element pattern 125r comprises silicon, the contact metal-semiconductor compound pattern 155r may be formed of a metal silicide. The contact metal-semiconductor compound pattern 155r is provided to reduce contact resistance between the passive element pattern 125r and a contact plug 180r electrically connected to the passive element pattern 125r. Accordingly, and as shown in the figure (region 75), the contact metal-semiconductor compound pattern 155r may be formed on a portion only of the upper surface of the passive element pattern 125r, including that which lies under the bottom surface of the contact plug 180r. On the other hand, a reaction prevention dielectric layer 152 may be disposed over that portion of the upper surface of the passive element pattern 125r which is not occupied by the contact metal-semiconductor compound pattern 155r.

The contact metal-semiconductor compound pattern 155r may include the same type of metal as the surface metal-semiconductor compound patterns 155a and 155b. For example, the metal-semiconductor compound patterns 155a, 155b, and 155r may include nickel, cobalt, or titanium. Also, the first interlayer dielectric layer 157a may cover the metal-semiconductor compound patterns 155a, 155b, and 155r.

In the illustrated example, a second interlayer dielectric layer 177 is disposed on the first interlayer dielectric layer 157a and the gate electrodes 175a and 175b. A first contact plug 180a extends through the second and first interlayer dielectric layers 177 and 157a in the first transistor region 50 and into contact with the first surface metal-semiconductor compound pattern 155a. A second contact plug 180b extends through the second and first interlayer dielectric layers 177 and 157a in the second transistor region 60 and into contact with the second surface metal-semiconductor compound pattern 155b. The aforementioned contact plug 180r (i.e., a third contact plug) extends through the second and first interlayer dielectric layers 177a and 157a of the passive element region 70 and into contact with the contact metal-semiconductor compound pattern 155r. Although not illustrated in the figure, gate contact plugs may extend through the second interlayer dielectric layer 177 and into contact with the first and second gate electrodes 175a and 175b, respectively. The contact plugs 180a, 180b, and 180r may comprise a metal such as tungsten, aluminum, or copper.

Figure 1B:
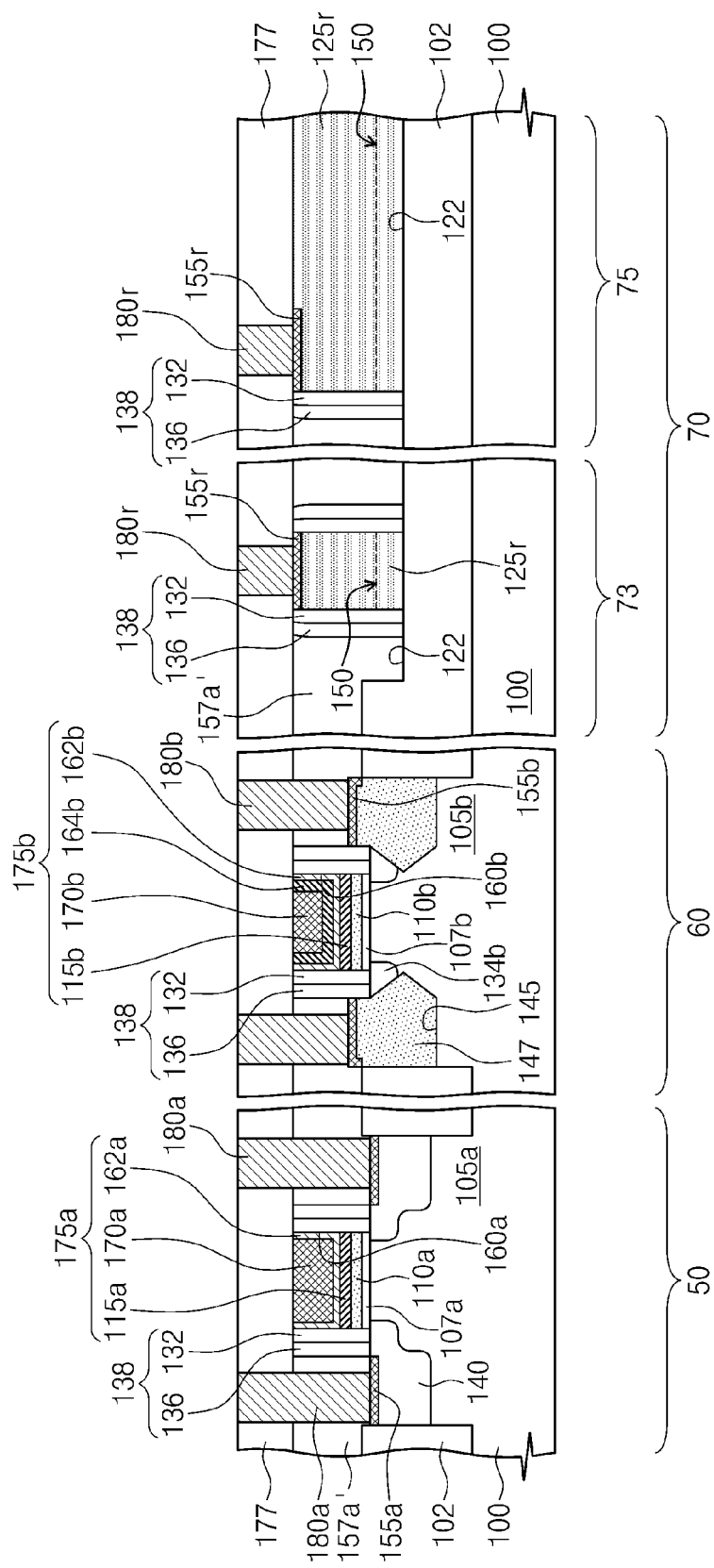
FIG. 1B is a sectional view of another example of the first embodiment of a semiconductor device according to the inventive concepts.

Another example of the first embodiment of a semiconductor device according to the inventive concepts will now be described with reference to FIG. 1B.

In the example of this embodiment, the upper surface of a first interlayer dielectric layer 157a' in the passive element region 70 is substantially disposed at the same level as the upper surface of a passive element pattern 125r. That is, the upper surface of the first interlayer dielectric layer 157a' is coplanar with the upper surface of the passive element pattern 125r. In the case in which the insulation spacers 138 are provided, the top of the insulation spacer 138 on the sidewall of the passive element pattern 125r is disposed at substantially with the same level as the upper surface of the first interlayer dielectric layer 157a'.

The upper surfaces of the first and second gate electrodes 175a and 175b are also coplanar with that of the first interlayer dielectric layer 157a' in the first and second transistor regions 50 and 60. Accordingly, the upper surfaces of the first and second gate electrodes 175a and 175b are disposed at substantially the same level as the upper surface of the passive element pattern 125r.

Furthermore, the third contact plug 180r extends through only the second of the interlayer dielectric layers (interlayer dielectric layer 177) and into contact with the contact metal-semiconductor compound pattern 155r.

Next, an embodiment of a method of fabricating a semiconductor device according to the inventive concept will be described with reference to FIGS. 2A through 2N.

Figure 2A:
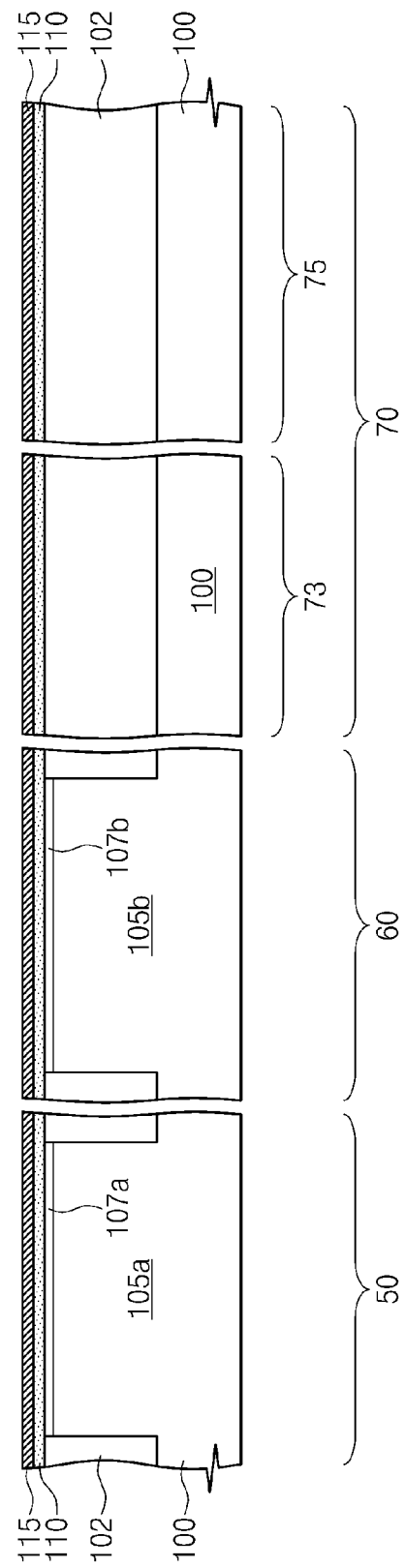
FIGS. 2A through 2N are sectional views illustrating a first embodiment of a method of fabricating a semiconductor device according to the inventive concepts.

Referring to FIG. 2A, a substrate 100 having regions corresponding to a first transistor region 50, a second transistor region 60, and a passive element region 70 of the device to be formed is provided. Also, a device isolation pattern 102 is formed in the substrate 100 to delimit a first active region 105a in the first transistor region 50 and a second active region 105b in the second transistor region 60. The first active region 105a may be doped with a first conductive dopant and the second active region 105b may be doped with a second conductive dopant. The device isolation pattern 102 is also formed throughout at least part of the passive element region 70 and may be formed throughout the entire passive element region 70.

According to the example of this embodiment of the inventive concepts, a first interfacial layer 107a is formed on the top surface of the first active region 105a, and a second interfacial layer 107b is formed on the top surface of the second active region 105b. The first and second interfacial layers 107a and 107b can be formed by an oxidation process. Furthermore, the first and second interfacial layers 107a and 107b have different thicknesses.

For example, a preliminary oxide layer is formed on the first and second active portions 105 and 105b by performing a first oxidation process. Next, the preliminary oxide layer on the second active portion 105b is removed. At this time, the preliminary oxide layer remains on the first active portion 105a. Next, a second oxidation process is performed. Thus, the first interfacial layer 107a is formed to be thicker than the second interfacial layer 107b. However, the inventive concept is not so limited. Rather, first and second interfacial layers 107a and 107b having the same thicknesses may be formed.

Referring still to FIG. 2A, a high-k dielectric layer 110 and a metal-containing layer 115 are then sequentially formed on the substrate 100. The high-k dielectric layer 110 is formed of dielectric material having a dielectric constant greater than that of silicon dioxide. For example, the high-k electric layer 110 may be formed of metal oxide such as a hafnium oxide and/or aluminum oxide. Thus, the high-k dielectric layer 110 may be single-layered or multi-layered. The metal-containing layer 115 may be a conductive metal nitride layer. In an example in which a PMOS transistor is formed in the second transistor region 60, the metal containing layer 115 is a titanium nitride layer.

Referring to FIG. 2B, a protective layer 117 is formed on the metal-containing layer 115. The protective layer 117 is formed of a semiconductor material such as silicon, germanium and/or silicon-germanium. A mask 119 is then formed on the protective layer 117. The mask 119 may be a patterned photoresist layer. In any case, the mask 119 covers the protective layer 117 in the first and second transistor regions 50 and 60, and exposes at least part of the protective layer 117 in the passive element region 70.

Referring to FIG. 2C, a recess is formed in the device isolation pattern 102 by sequentially etching the protective layer 117, the metal-containing layer 115, and the high-k dielectric layer 110 using the mask 119 as an etching mask. As a result, a recessed portion 122 of the device isolation pattern 102 is formed in the passive element region 70. This etching process is carried out until a bottom surface of the recessed portion 122 (the surface which delimits the bottom of the recess) lies in a plane beneath a plane coincident with the upper surfaces of the first and second active regions 105a and 105b.

Referring to FIG. 2D, the mask 119 is removed. In an example of this embodiment, the mask 119 is removed by an oxygen ashing process. Alternatively, though, the mask 119 may be removed by an oxygen-free ashing process such as a nitrogen/hydrogen ashing process, a hydrogen ashing process, and/or an argon ashing process. A natural oxide layer and/or an oxide layer produced by the aforementioned oxygen ashing process may be formed on the protective layer 117. Therefore, a cleaning process may be performed to remove the oxide layer from the protective layer 117.

After the mask 119 is removed and any required cleaning process is performed, a dummy layer 128 is formed over the entire substrate 100 including over the recessed portion 122 of the device isolation pattern 102. The dummy layer 128 comprises and may consist of a semiconductor layer 125 formed on the protective layer 117 in the first and second transistor regions 50 and 60 and on the bottom surface of the recessed portion 122 of the device isolation pattern 102 in the passive element region 70. The semiconductor layer 125 can be formed of silicon, germanium and/or silicon-germanium. The dummy layer 128 may also include a hard mask 127 formed on the semiconductor layer 125. In this case, the hard mask 127 is preferably of dielectric material having an etch selectivity with respect to the semiconductor layer 125. For example, a hard mask 127 of a nitride layer and/or an oxynitride layer may be formed on the semiconductor layer. An embodiment in which the dummy layer 128 is formed of both the semiconductor layer 125 and the hard mask 127 will be described below for convenience of description but, as was stated above, the hard mask 127 may be omitted in some applications.

Figure 2E:
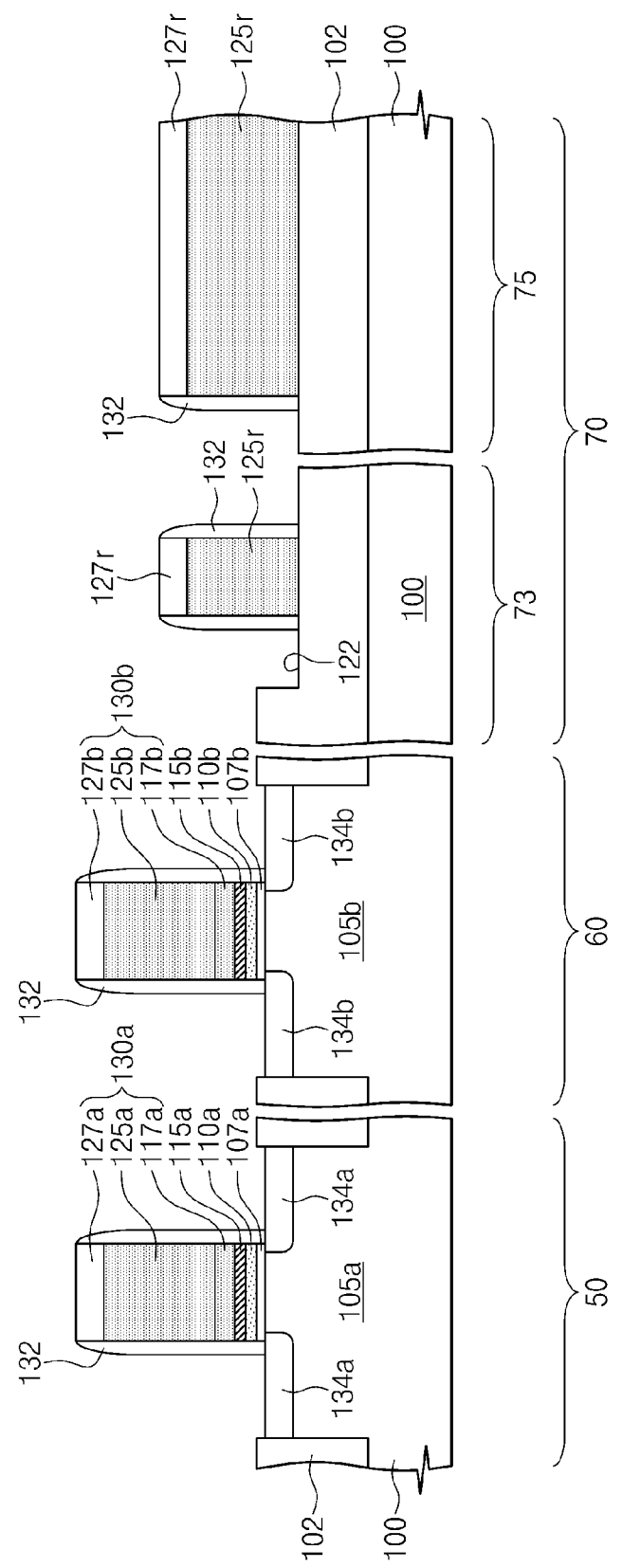

Referring to FIGS. 2D and 2E, a first high-k dielectric pattern 110a, a first metal-containing pattern 115a, and a first dummy gate pattern 130a stacked one atop the other in the foregoing order are formed by patterning the dummy layer 128, the protective layer 117, the metal-containing layer 115, and the high-k dielectric layer 110 in the first transistor region 50. The first dummy gate pattern 130a, in this example, includes a first protective pattern 117a, a first dummy semiconductor pattern 125a and a first dummy hard mask pattern 127a stacked one atop the other. The first interfacial layer 107a may be removed from the first active region 105a at the both sides of the first dummy gate pattern 130a while the first dummy gate pattern 130a is formed.

A second high-k dielectric pattern 110b, a second metal-containing pattern 115b, and a second dummy gate pattern 130b stacked one atop the other are formed by patterning the dummy layer 128, the protective layer 117, the metal-containing layer 115, and the high dielectric layer 110 in the second transistor region 60. As a result, in this example, the second dummy gate pattern 130b includes a second protective pattern 117b, a second dummy semiconductor pattern 125b, and a second dummy hard mask pattern 127b stacked one atop the other. The second interfacial layer 107b may be removed from the second active region 105b at both sides of the second dummy gate pattern 130b while the second dummy gate pattern 130b is formed.

A passive element pattern 125r and a capping hard mask pattern 127r stacked on the passive element pattern 125r are formed by patterning the dummy layer 128 in the passive element region 70.

In an example of this embodiment, the first and second dummy gate patterns 130a and 130b and the passive element pattern 125r are formed simultaneously. For example, the dummy gate patterns 130a and 130b and the passive element pattern 125r are formed using a single photolithography process. However, the inventive concept is not so limited. That is, the passive element pattern 125r may be formed after the first and second dummy gate patterns 130a and 130b are formed (simultaneously), or the first and second dummy gate patterns 130a and 130b may be formed (simultaneously) after the passive element pattern 125r is formed.

In any case, the upper surface of the capping hard mask pattern 127r is disposed in plane beneath a plane coincident with the upper surfaces of the first and second dummy gate patterns 130a and 130b due to the fact that the passive element pattern 127r is formed on the recessed portion 122 of the isolation pattern 102.

Referring still to FIG. 2E, a first spacer layer may be conformally formed on the substrate 100 after the patterns 130a, 130b, and 125r have been formed. In this case, the first spacer layer is then anisotropically etched to form a first spacer 132 on each of the sidewalls of the patterns 130a, 130b, and 125r. The first spacers 132 may, as examples, be formed of an oxide, a nitride and/or an oxynitride.

Dopant ions of a second conductivity type are implanted in the first active region 105a using the first spacer 132 and the first dummy gate pattern 130a in the first transistor region 50 as a mask. As a result, a first source/drain extension 134a is formed. Dopant ions of a first conductivity type are implanted in the second active region 105b using the first spacer 132 and the second dummy gate pattern 130b in the second MOS transistor region 60 as a mask. As a result, a second source/drain extension 134b is formed. The second source/drain extension 134b may be formed before or after the first source/drain extension 134a is formed. In either case, the passive element pattern 125r and the capping hard mask pattern 127r may be covered by a mask while the first and second source/drain extensions 134a and 134b are formed.

Referring to FIG. 2F, a second spacer layer may be conformally formed on the substrate 100. The second spacer layer may be formed of an oxide, a nitride and/or an oxynitride. In this case, the second spacer layer is anisotropically etched to form second spacers 136. Accordingly, insulation spacers 138 may be formed on the sidewall of the first dummy gate pattern 130a, the sidewall of the second dummy gate pattern 130b, and the sidewall of the passive element pattern 125r, respectively. The insulation spacers 138 also cover the sidewalls of the first hard mask pattern 127a, the second hard mask pattern 127b, and the capping hard mask pattern 127r.

Furthermore, a relatively high dosage of dopant ions of the second conductivity type are implanted in the first active portion 105a using the insulation spacer 138 and the first dummy gate pattern 130a in the first transistor region 50 as a mask. Thus, a first source/drain region 140 is formed.

Next, a patterned epitaxial prevention layer 143 may be formed on the substrate 100 (i.e., an epitaxial prevention layer may be formed on the substrate 100, and patterned using a conventional process). In this case, the epitaxial prevention layer 143 exposes the second active region 105b at the both sides of the second dummy gate pattern 130b and the insulation spacer 138 in the second transistor region 60. Furthermore, an active recess 145 is formed by etching the exposed portion of the second active region 105b of the substrate 100. In an example of this embodiment, the exposed second active portion 105b is etched using a selective wet etching process. The selective wet etching process can use an atomic plane of the crystal lattice of the substrate 100 as an etch stop. For example, the selective wet etching process can use a {111} crystal plane of the substrate 100 as an etch stop. Accordingly, the active region 105b may be tapered toward the channel region below the second dummy gate pattern 130b due to the shape of the active recess 145 produced by such an etching process. If the substrate 100 is a silicon substrate, the selective wet etching process may be carried out by using a directional etching solution including ammonia and/or tetramethyl ammonium hydroxide (TMAH).

Figure 2G:
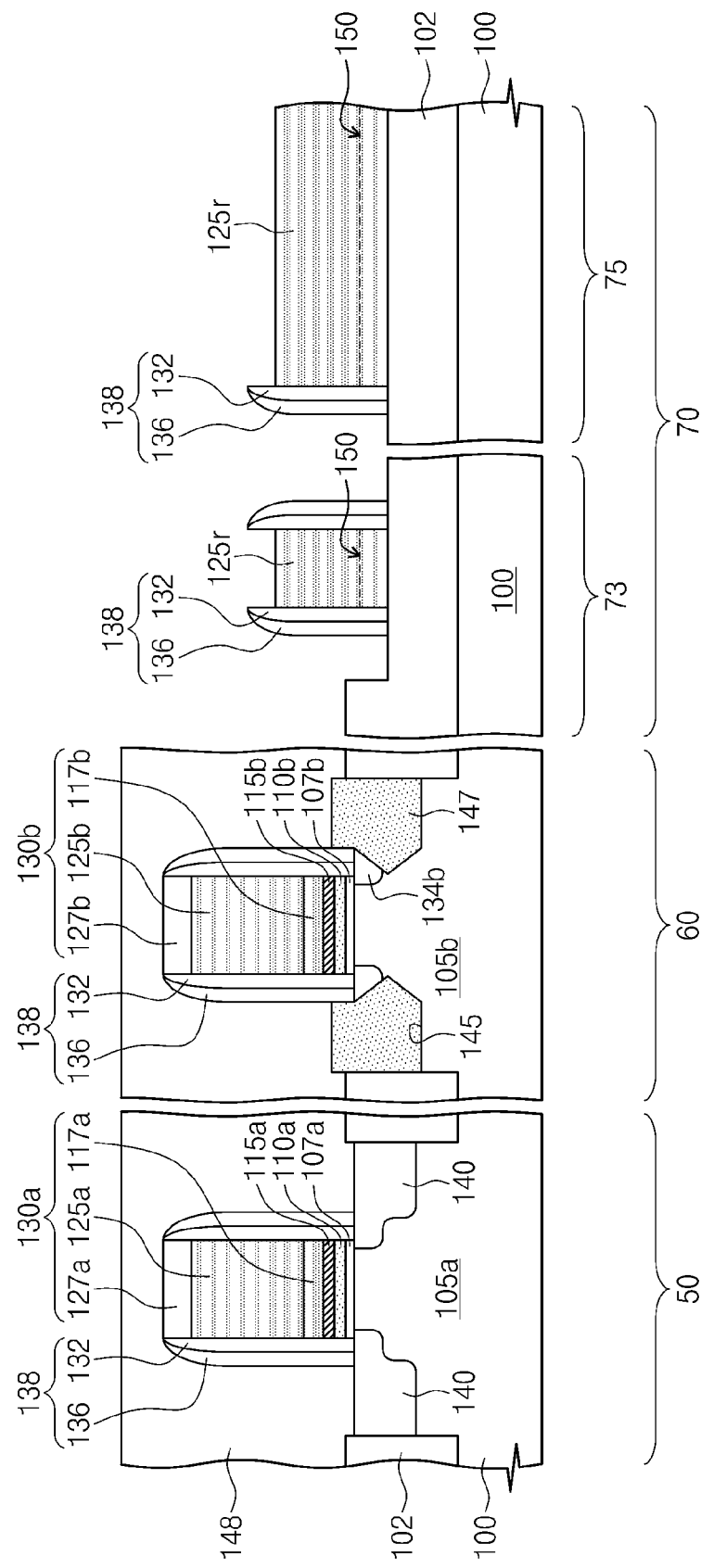

Referring to FIG. 2G, in this example, a selective epitaxial growth process is performed on the substrate 100 to fill the active recess 145 with a stress pattern 147. As mentioned above, if a PMOS transistor is formed in the second transistor region 60 and the substrate 100 is formed of silicon, the stress pattern 147 may be formed of silicon-germanium. The stress pattern 147 may be in a crystalline state (e.g., a single-crystalline state). Also, the stress pattern 147 may be doped with dopant of the first conductivity type by an in-situ method or by carrying out an ion implantation method after the stress pattern 147 is formed. At this time, the epitaxial prevention layer 143 prevents an epitaxial layer from being grown on regions of the substrate 100 other than that which defines the active recess 145.

Then, the epitaxial prevention layer 143 is removed.

Next, a mask 148 is formed on the substrate 100 to cover the first and second transistor regions 50 and 60 and leave the capping hard mask pattern 127r in the passive element region 70 exposed. The exposed capping hard mask pattern 127r is removed by an etching process using the mask 148 as an etching mask. As a result, the top of the spacer 138 on the sidewall of the passive element pattern 125r projects above the level of the upper surface of the passive element pattern 125r.

Next, the passive element pattern 125r is doped to adjust its resistivity. The dopant may be an n-type dopant or a p-type dopant. In this respect, an upper portion only (e.g., the portion above boundary 150 in the figure) or the entirety of the passive element pattern 125r may be doped. For example, the upper portion only of the passive element pattern 125r can be doped by implanting ions therein or the entire passive element pattern can be uniformly doped using an in-situ method.

Figure 2H:
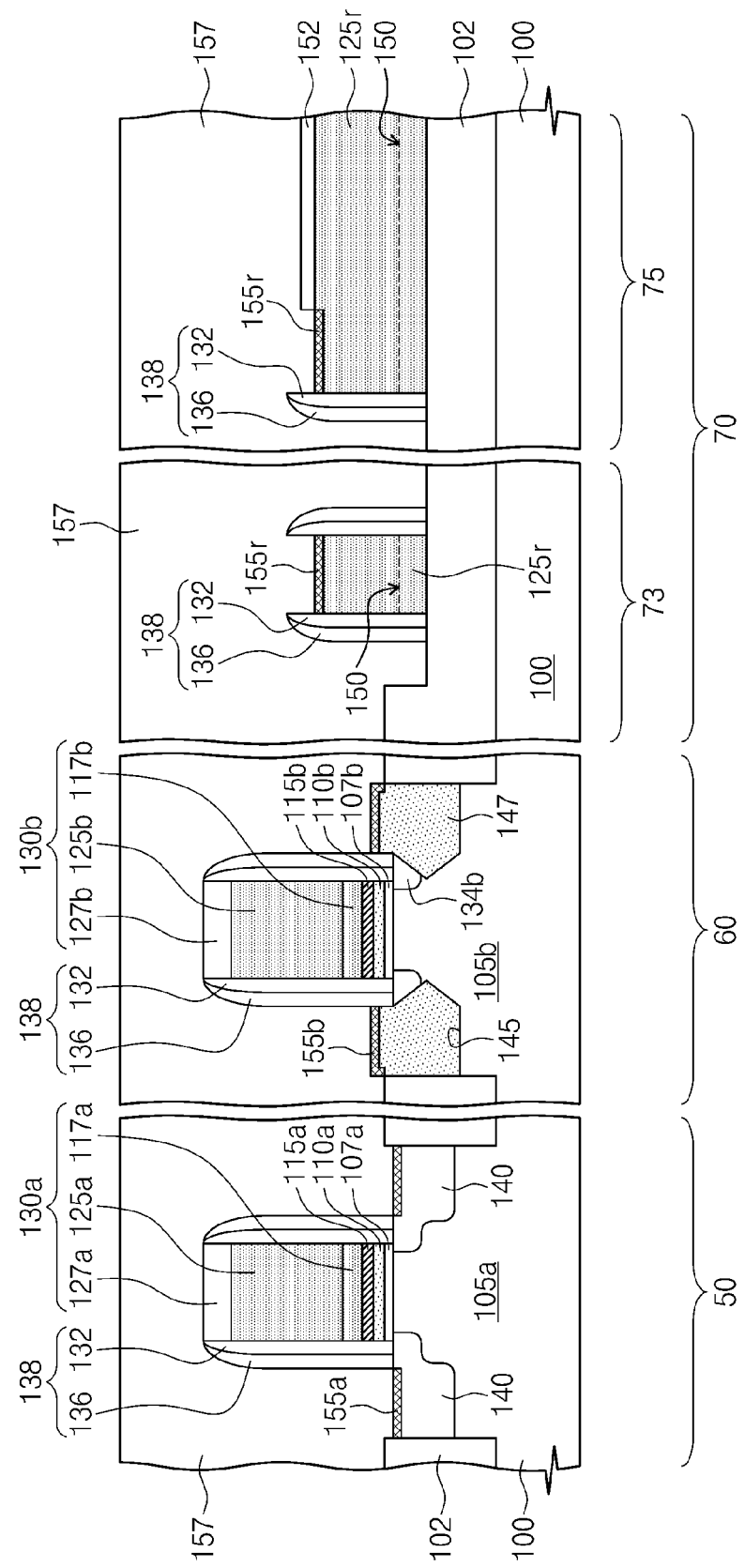

Referring to FIG. 2H, next, the mask 148 is removed. Then, a patterned reaction prevention layer 152 is formed on the substrate 100 (i.e., a reaction prevention layer is formed on the substrate and is then patterned using a conventional process). The reaction prevention layer 152 exposes the first source/drain region 140, the stress pattern 147, and a portion of the upper surface of the passive element pattern 125r.

Subsequently, a metal layer is formed on the substrate 100 and then a metal-semiconductor reaction process is performed. Accordingly, a first surface metal-semiconductor compound pattern 155a is formed on the first source/drain region 140, a second surface metal-semiconductor compound pattern 155b is formed on the stress pattern 147, and a contact metal-semiconductor compound pattern 155r is formed on a portion of the upper surface of the passive element pattern 125r. The process of forming the metal layer and the metal-semiconductor reaction process may be performed in-situ in the same process chamber of semiconductor device manufacturing equipment. Then, the un-reacted metal layer (which exists over the non-semiconductor regions of the structure) is removed.

Next, a first interlayer dielectric layer 157 is formed on the substrate 100. The first interlayer dielectric layer 157 may include an oxide, a nitride and/or an oxynitride.

Figure 2I:
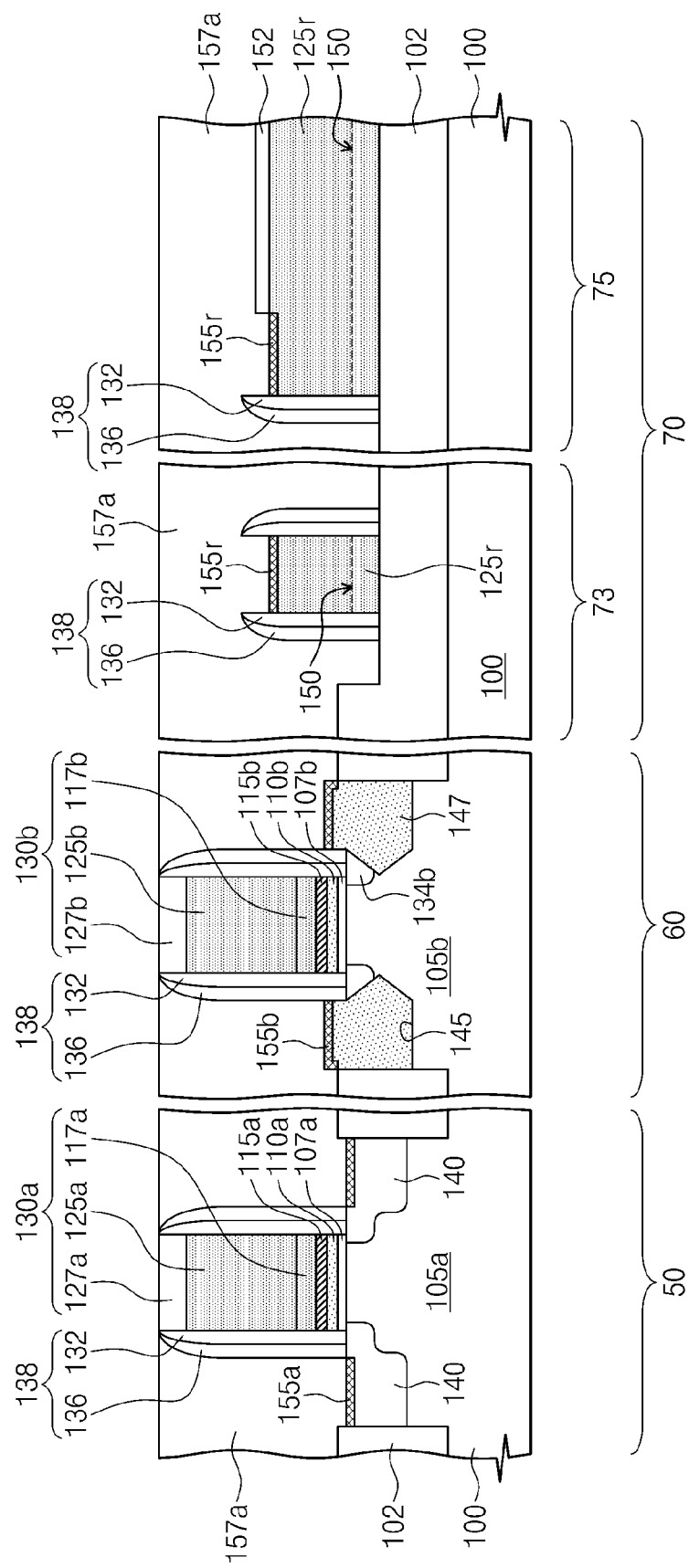

Referring to FIG. 2I, the first interlayer dielectric layer 157 is planarized until the first and second dummy gate patterns 130a and 130b are exposed. During this process, the upper surface of the passive element pattern 125r in the passive element region 70 is disposed in plane beneath a plane coincident with the upper surfaces of the dummy gate patterns 130a and 130b. Accordingly, the upper surface of first interlayer dielectric layer 157a remains above the passive element pattern 125r in the passive element region 70. Also, according to an embodiment of the inventive concept, the upper surface of the first interlayer dielectric layer 157a remains above the top of the insulation spacer 138 on the sidewall of the passive element pattern 125r.

Figure 2J:
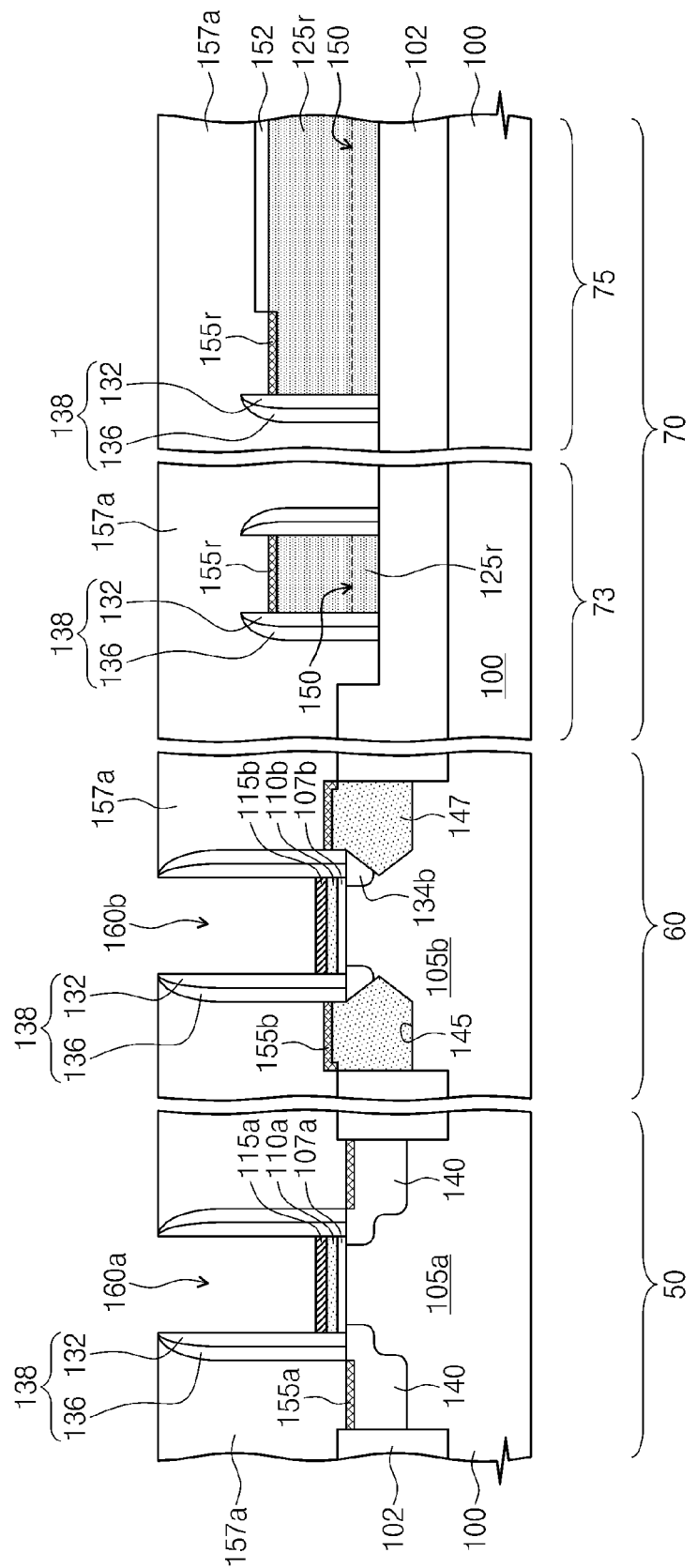

Referring to FIG. 2J, the exposed first and second dummy gate patterns 130a and 130b are removed to form a first opening 160a exposing the first metal-containing pattern 115a and a second opening 160b exposing the second metal-containing pattern 115b. At this time, the passive element pattern 125r is protected by the first interlayer dielectric layer 157a.

Figure 2K:
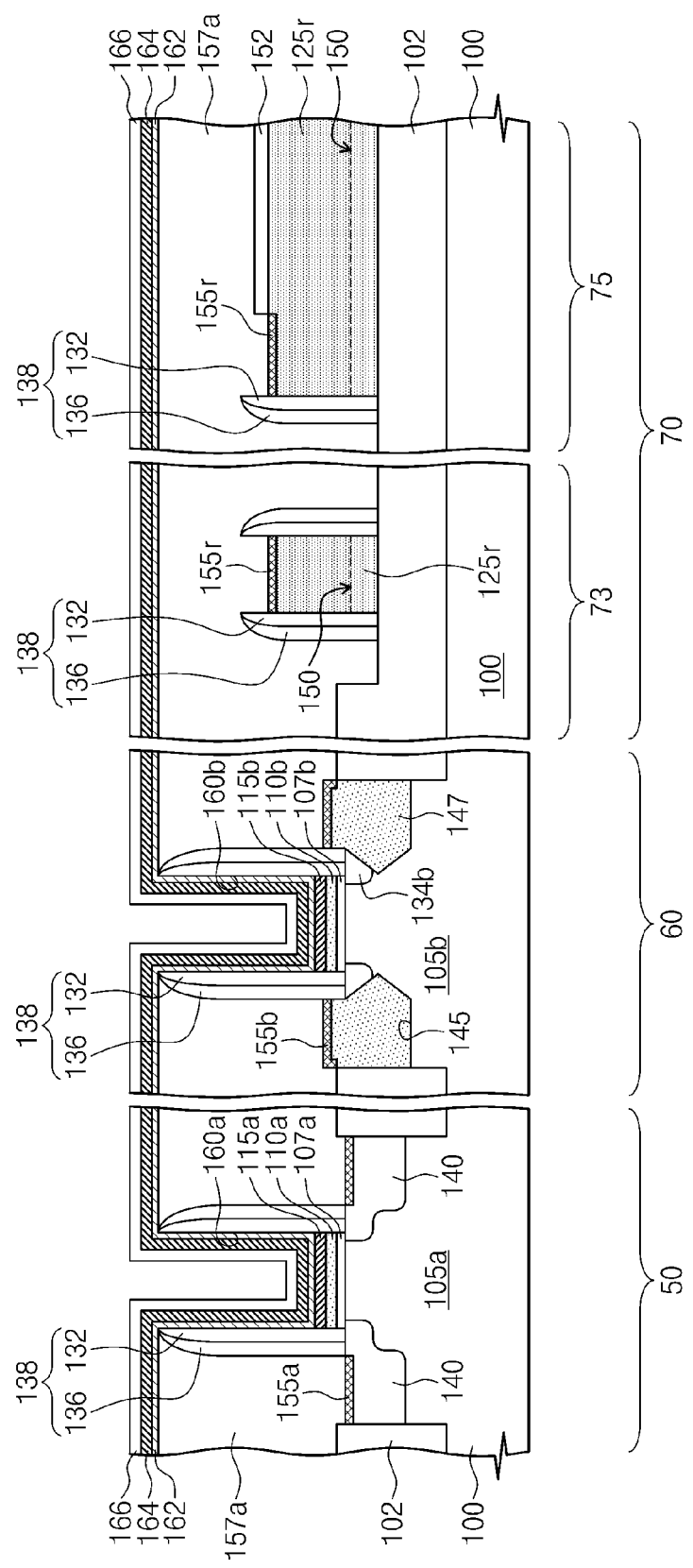

Referring to FIG. 2K, an etching barrier conductive layer 162 is conformally formed on the substrate 100. Furthermore, a diffusion barrier conductive layer 164 is conformally formed on the etching barrier conductive layer 162. The etching barrier conductive layer 162 is preferably formed of a conductive metal nitride layer having an etch selectivity with respect to the diffusion barrier conductive layer 164. The diffusion barrier conductive layer 164 is preferably formed to a thickness greater than that of the etching barrier conductive layer 162. A blocking dielectric layer 166 is then formed on the diffusion barrier conductive layer 164. The blocking dielectric layer 166 may be formed of an oxide, a nitride and/or an oxynitride.

Figure 2L:
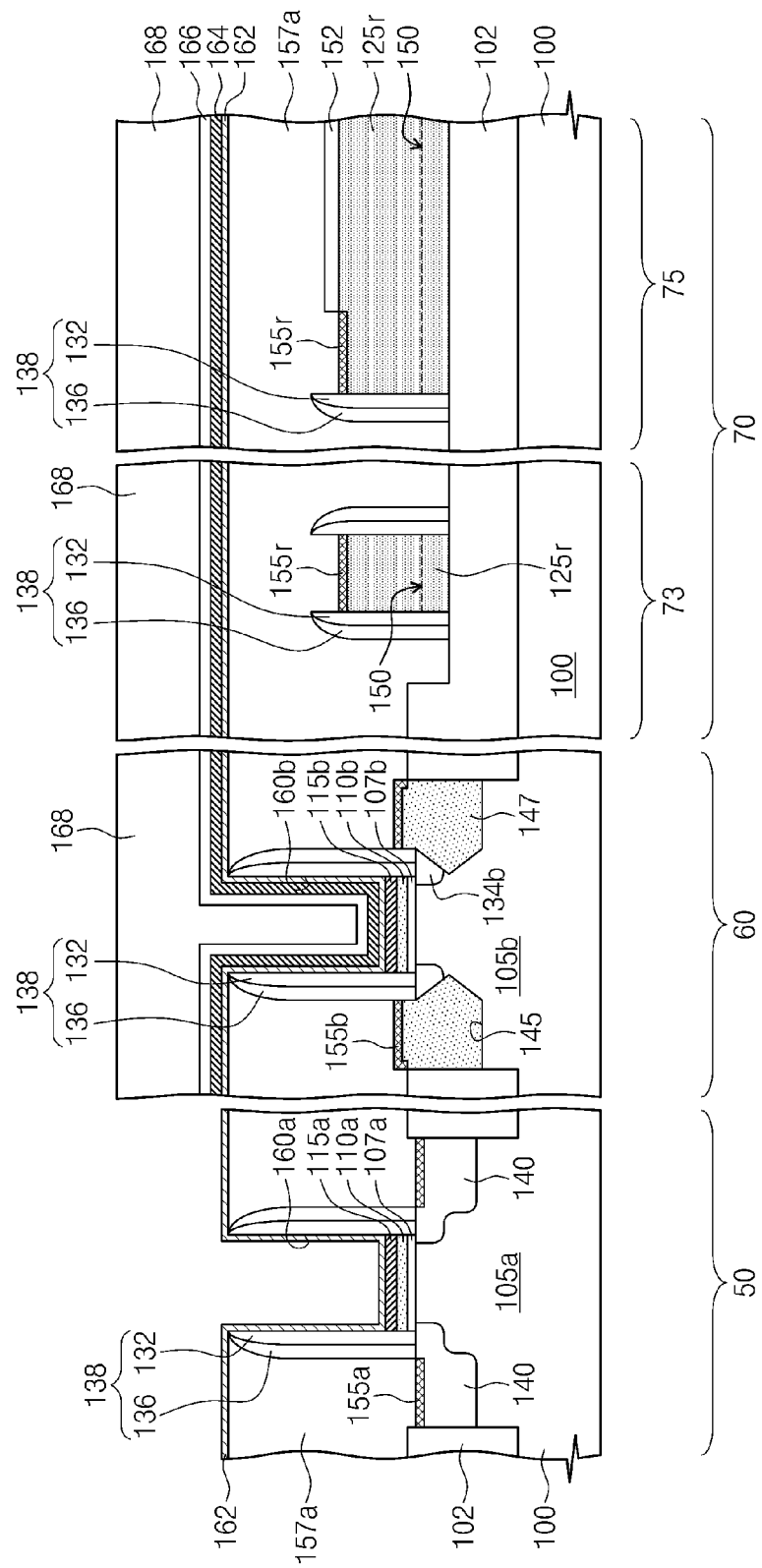

Referring to FIG. 2L, next, a mask 168 is formed on the substrate 100 to cover the blocking dielectric layer 166 in the second transistor region 60 and leave the blocking dielectric layer 166 in the first transistor region 50 exposed. The mask 168 may also cover the blocking dielectric layer 166 in the passive element region 70. The blocking dielectric layer 166 and the diffusion barrier layer 164 in the first transistor region 50 are then etched away using the mask pattern 168 as an etching mask. Accordingly, the etching barrier conductive layer 162 in the first transistor region 50 is exposed.

Figure 2M:
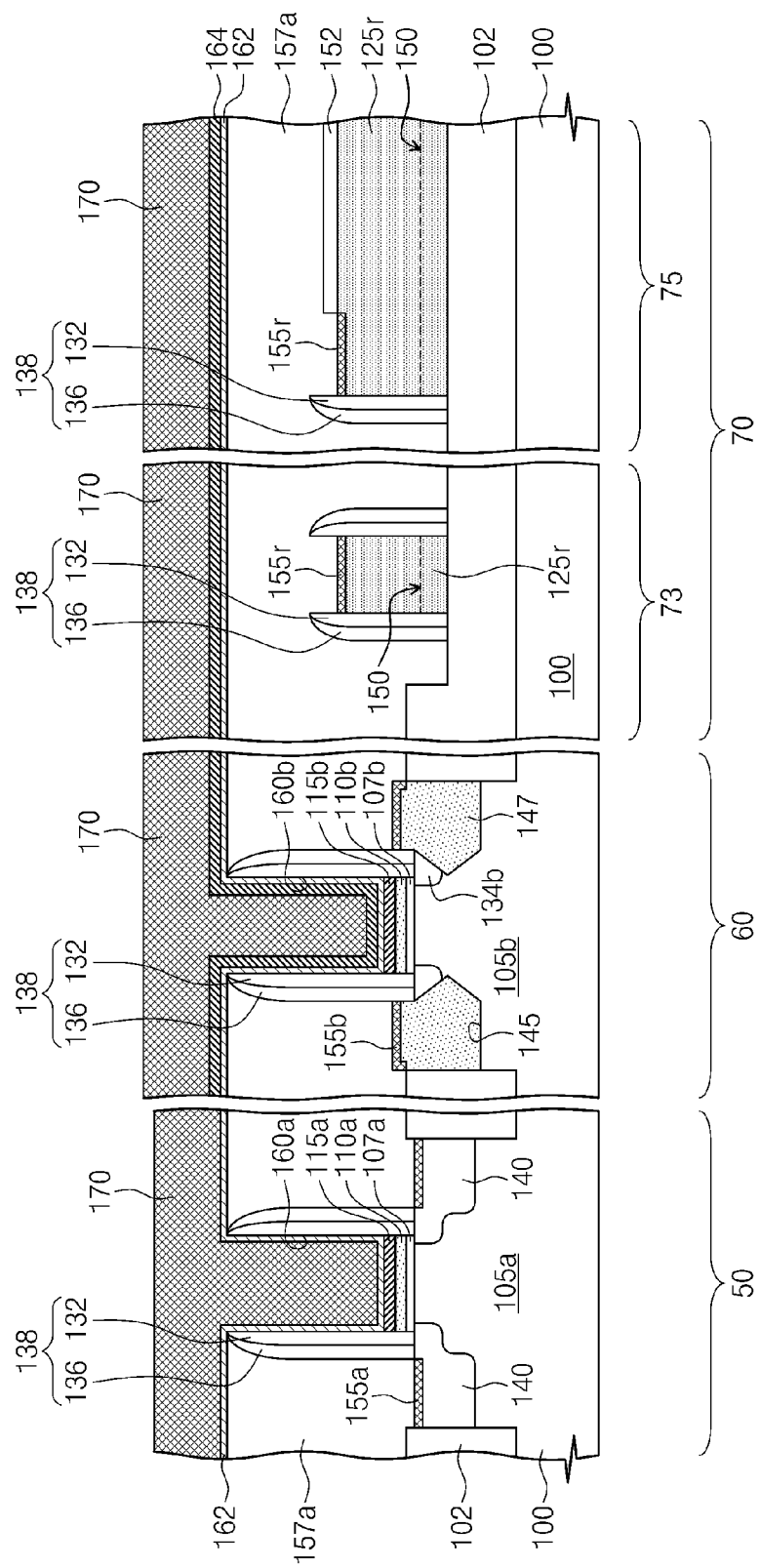

Referring to FIG. 2M, next, the mask 168 is removed and the blocking dielectric layer 166 in the second transistor region 60 and in the passive element region 70 is removed. Accordingly, the diffusion barrier conductive layer 164 in the second transistor region 60 and in passive element region 70 is exposed.

Next, a metal layer 170 is formed on the substrate 100 to such a thickness as to fill the first and second openings 160a and 160b. The metal layer 170 may be formed on the etching barrier conductive layer 162 in the first transistor region 50 and on the diffusion barrier conductive layer 164 in the second transistor region 50. The metal layer 170 is of metal element having a resistivity lower than that of the first and second metal containing patterns 115a and 115b. Moreover, the metal layer 170 includes a metal that diffuses into the first metal-containing pattern 115a to change its work function. For example, the metal layer 170 may comprise aluminum. In this case, an adhesive layer (e.g., of titanium) may be formed below the aluminum layer.

Figure 2N:
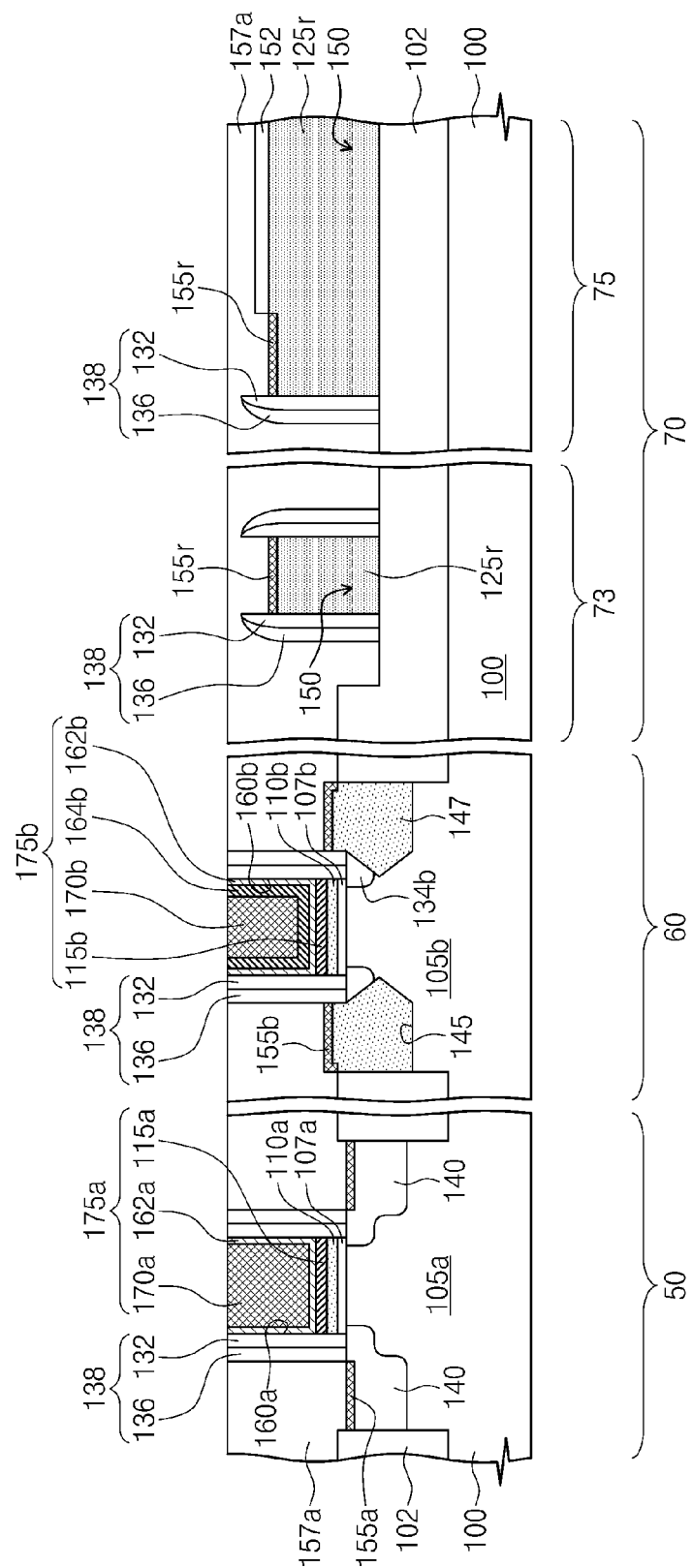

Referring to FIG. 2N, the metal layer 170, the diffusion barrier conductive layer 164, and the etching barrier conductive layer 162 are planarized until the first interlayer dielectric layer 157a is exposed, thereby forming a first gate electrode 175a in the first opening 160a and a second gate electrode 175b in the second opening 160b. In the example described so far, the first gate electrode 175a thus includes a first metal-containing pattern 115a, a first etching barrier conductive pattern 162a, and a first metal pattern 170a stacked one atop the other in the foregoing order. The second gate electrode 175b includes a second metal-containing pattern 115b, a second etching barrier conductive pattern 162b, a diffusion barrier pattern 164b, and a second metal pattern 170b stacked in the foregoing order one atop the other. As mentioned above, metal (e.g., aluminum) in the first metal pattern 170a of the first gate electrode 175a diffuses into the first metal-containing pattern 115a due to the lack of a diffusion barrier. Accordingly, the work function of the first metal-containing pattern 115a is different from that of the second metal-containing pattern 115b.

In this example of the inventive concepts as shown in the figure, an upper portion of the first interlayer dielectric layer 157a and upper portions of the insulation spacers 138 in the first and second transistor regions 50 and 60 are removed by the planarization process for forming the gate electrodes 175a and 175b. Regardless, the first interlayer dielectric layer 157a remains over the passive element pattern 125r in the passive element region 70.

Furthermore, as was described above, the first dummy gate pattern 130a was formed of two semiconductor layers 117a and 125a, and the second dummy gate pattern 130b was formed of two semiconductor layers 117b and 125b. On the other hand, the passive element pattern 125r was formed of only a single semiconductor layer 125, i.e., was formed of the same semiconductor layer as that constituting the semiconductor layers 125a and 125b of the dummy gate patterns 130a and 130b. Hence, the thickness of that portion of the metal layer 170 which fills the openings 160a and 160b corresponds to the height of the dummy gate patterns 130a and 130b and is greater than the height of the passive element layer pattern 125r. Even though the planarization process used to form the gate electrodes 175a and 175b removes an upper portion of the first interlayer dielectric layer 157a and portions of the metal layer 170 filling the openings 160a and 160b, the upper surface of the first interlayer dielectric layer 157a remains above the passive element pattern 125r in the passive element region 70. That is, the passive element pattern 125r is protected during the planarization process and the height of the passive element pattern 125r remains equal to the thickness of the semiconductor layer 125 in the dummy layer. Therefore, it can be readily appreciated that the forming of the protective layer 117 allows for the heights of the first and second gate electrodes 175a and 175b, as measured from the upper surfaces of the first and second metal-containing patterns 115a and 115b to the upper surfaces of the first metal pattern 170a, respectively, to be substantially equal to the height of the passive element pattern 125r even though none of the semiconductor layer constituting the passive element pattern 125r is removed and yet the structure is planarized to a level below the upper surfaces of the semiconductor layers 125a and 125b of the dummy gate patterns 130a and 130b.

Finally, a semiconductor device of the type shown in and described above with reference to FIG. 1A may be realized by using conventional processes to additionally form the second interlayer dielectric layer 177 and the contact plugs 180a, 180b, and 180r shown in the figure.

A semiconductor device of the type shown in and described above with reference FIG. 1B may be realized beginning with the same processes described above with reference to FIGS. 2A through 2M. Subsequently, the metal layer 170, the diffusion barrier conductive layer 164, the etching barrier conductive layer 162, and the first interlayer dielectric layer 157a are planarized until the passive element pattern 125r is exposed, thereby forming the first and second gate electrodes 175a and 175b. Finally, the second interlayer dielectric layer 177 and the contact plugs 180a, 180b, and 180r are formed.

Another example of the first embodiment of a method of fabricating a semiconductor device according to the inventive concepts begins with the processes illustrated in FIGS. 3A through 3D. Note, those portions of the processes which are otherwise similar to those described above with reference to FIGS. 2A-2D will not be described in detail for the sake of brevity.

Referring to FIG. 3A, a protective layer 217 comprising an oxide layer, a nitride layer and/or an oxynitride layer is formed on metal-containing layer 115. Mask 119 is then formed on the protective layer 217.

Figure 3B:
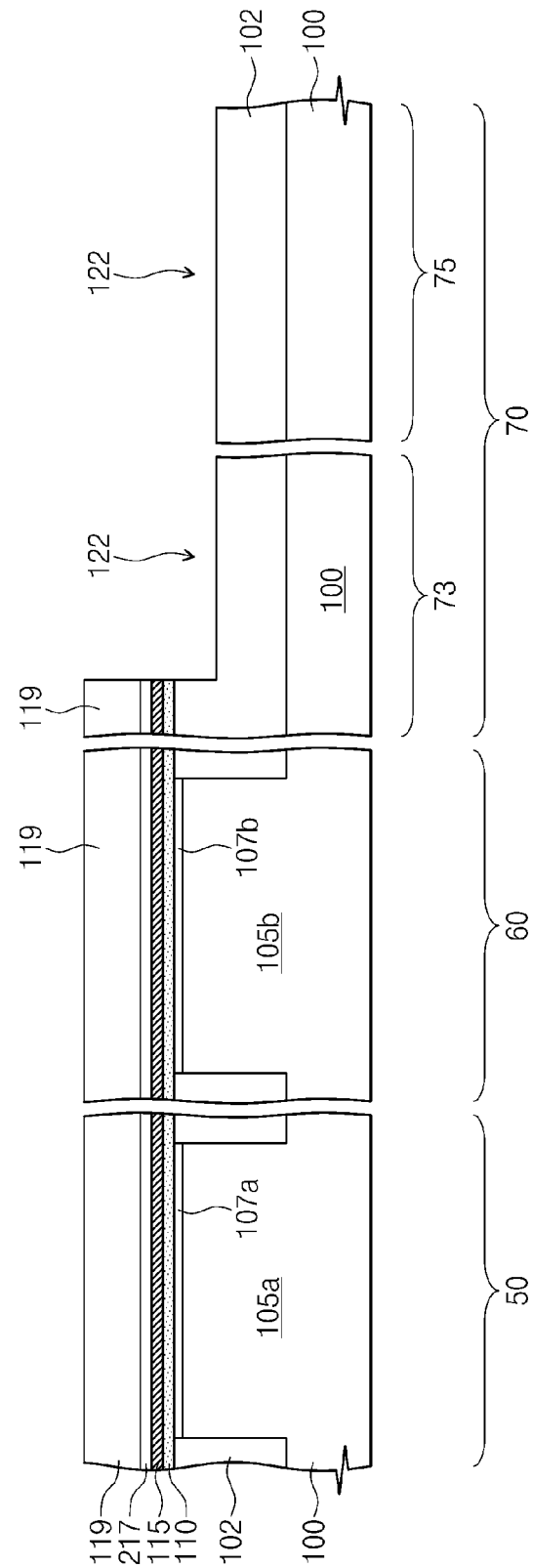

Referring to FIG. 3B, the protective layer 217, the metal-containing layer 115, the high-k dielectric layer 110, and the device isolation pattern 102 are etched in the passive element region 70 using the mask 119 as an etching mask to form a recess in the upper surface of the device isolation pattern 102, i.e., to form the recessed portion 122 of the device isolation pattern 102.

Figure 3C:
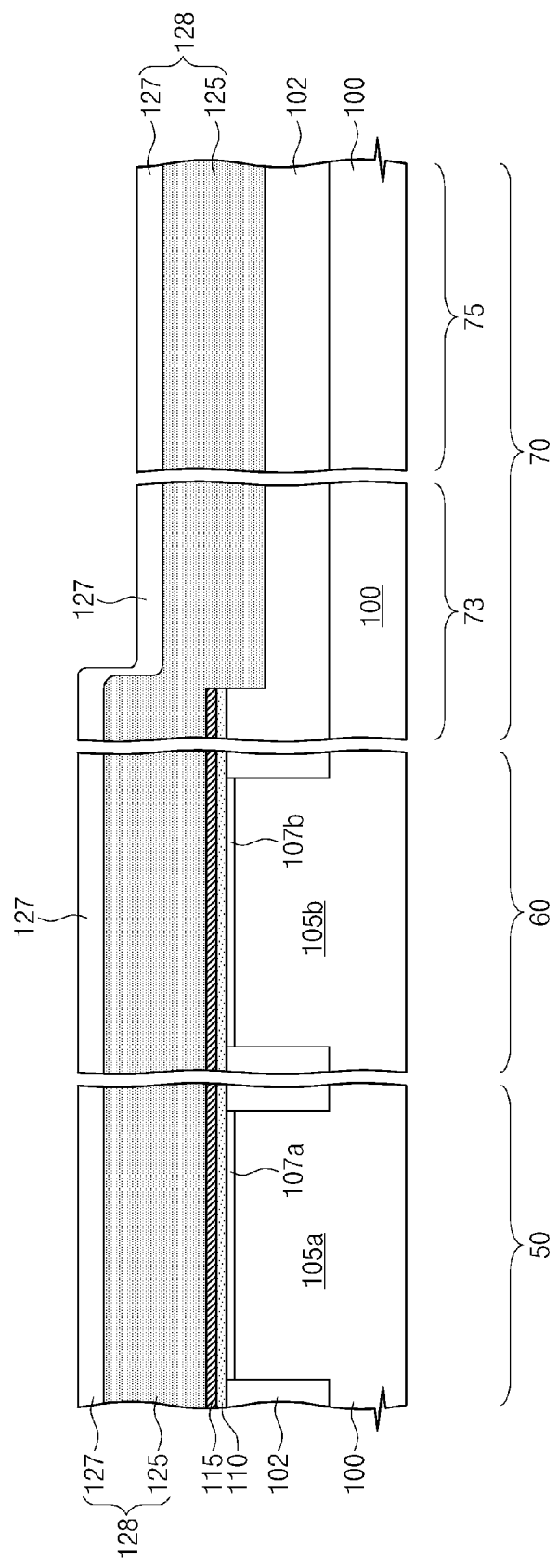

Referring to FIG. 3C, the mask 119 is then removed by an oxygen ashing process or an oxygen-free ashing process. Then, the remnant of the protective layer 217 is removed. The metal-containing layer 115 in the first and second transistor regions 50 and 60 is prevented from being oxidized, even if the mask 119 is removed using an oxygen ashing process, because the protective layer 217 protects the metal-containing layer 115. Moreover, the protective layer 217 can be easily removed because it is formed of a dielectric material.

Next, dummy layer 128 is formed on the substrate 100. In this respect, the semiconductor layer 125 is formed directly on the metal-containing layer 115 in the first and second transistor regions 50 and 60. Note, as was described above, a cleaning process may be performed before the semiconductor layer 125 is formed.

Figure 3D:
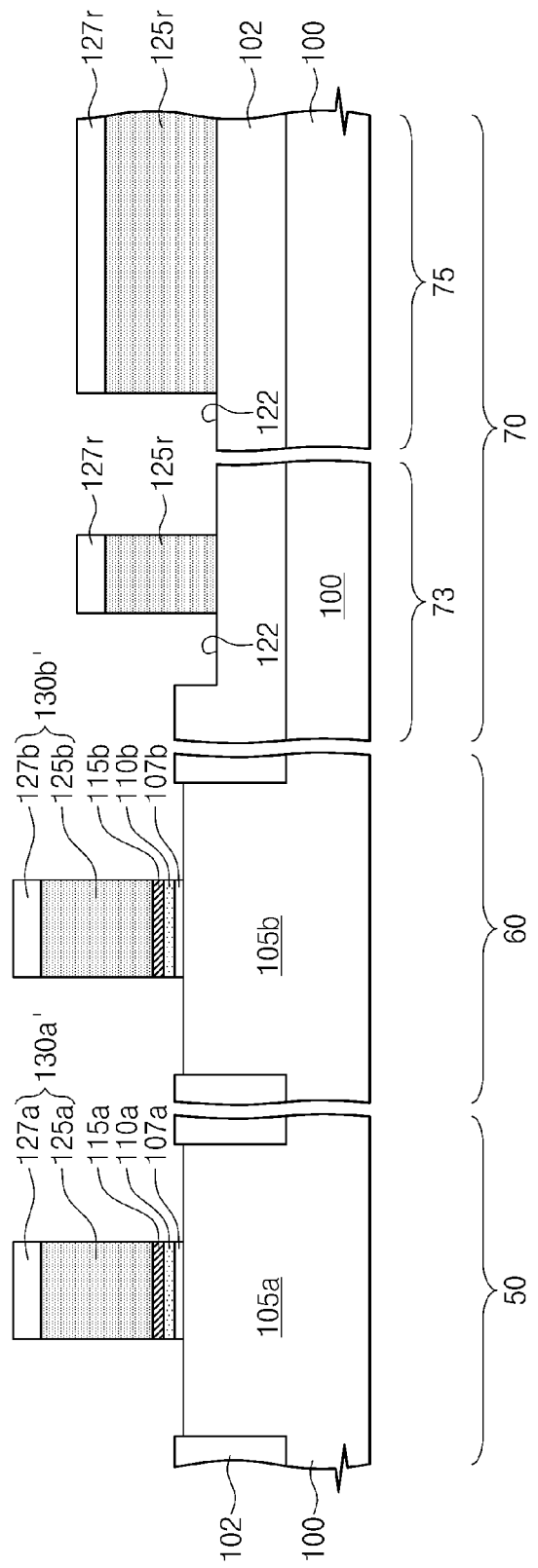

Referring to FIGS. 3C and 3D, first high-k dielectric pattern 110a, a first metal-containing pattern 115a and first dummy gate pattern 130a' are formed by patterning the dummy layer 128, the metal-containing layer 115, and the high dielectric layer 110 in the first transistor region 50. The first dummy gate pattern 130a' may include first dummy semiconductor pattern 125a and first dummy hard mask pattern 127a. Second high-k dielectric pattern 110b, second metal-containing pattern 115b, and second dummy gate pattern 130b' are formed by patterning the dummy layer 128, the metal-containing layer 115, and the high-k dielectric layer 110 in the second transistor region 60. The second dummy gate pattern 130b' may include second dummy semiconductor pattern 125b and second dummy hard mask pattern 127b. Furthermore, passive element pattern 125r and capping hard mask pattern 127r are formed by patterning the dummy layer 128 in the passive element region 70. The dummy gate patterns 130a' and 130b' and the passive element pattern 125r may be formed simultaneously or the dummy gate patterns 130a' and 130b' may be formed before or after the passive element pattern 125r is formed.

Next, processes similar to those shown in and described with reference to FIGS. 2E through 2N are performed. In this case, the height of the first and second gate electrodes formed in the first and second transistor regions 50 and 60, respectively, may be less than the height of the passive element pattern 125r.

Figure 4B:
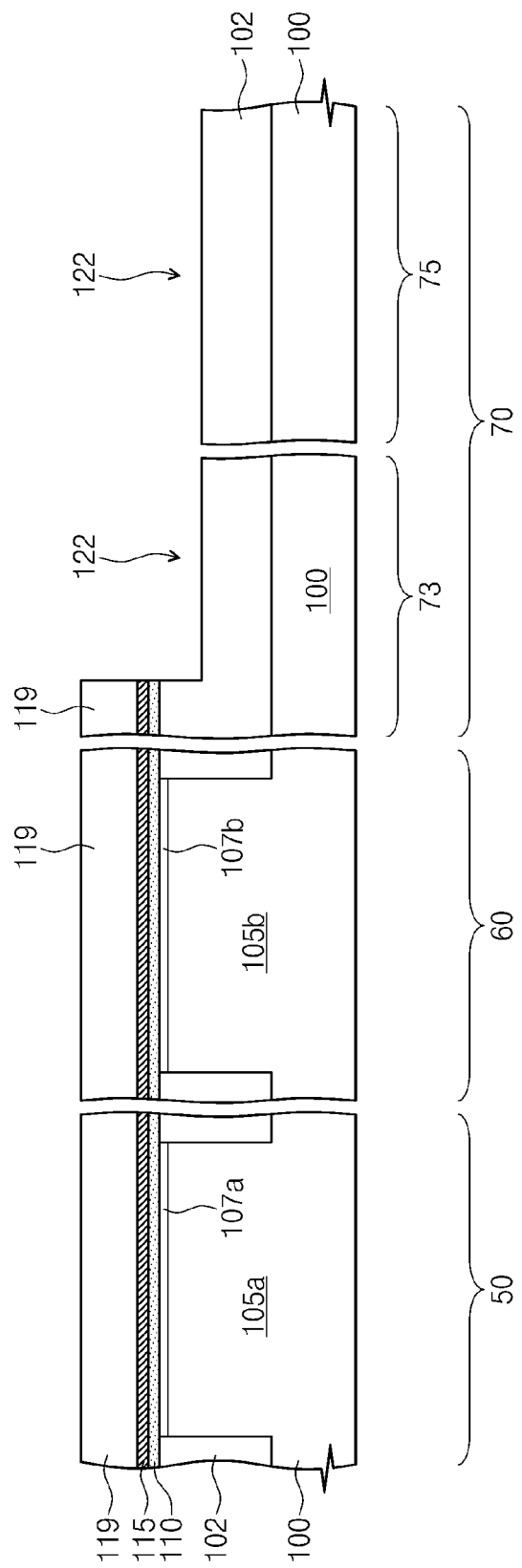

Another example of the first embodiment of a method of fabricating a semiconductor device according to the inventive concepts begins with the processes illustrated in FIGS. 4A and 4B. Note, those portions of the processes which are otherwise similar to those described above with reference to FIGS. 2A and 2B will not be described in detail for the sake of brevity Referring to 4A, mask 119 is formed directly on the metal-containing layer 115.

Referring to FIG. 4B, a recess in the device isolation pattern 102, i.e., recessed portion 122 of the device isolation pattern 102, is formed by patterning the metal-containing layer 115, the high dielectric layer 110, and the device isolation pattern 102 in the passive element region 70.

In this example, the mask 119 is removed using an oxygen-free ashing process after the recessed portion 122 has been formed. Accordingly, the oxidizing of the metal-containing layer 115 below the mask 119 is minimized while the mask 119 is removed. As mentioned above, the oxygen-free ashing process may include at least one of a nitrogen/hydrogen ashing process, a hydrogen ashing process, or an argon ashing process.

Next, processes similar to those described above with reference to FIGS. 2E through 2N are performed.

Figure 5A:
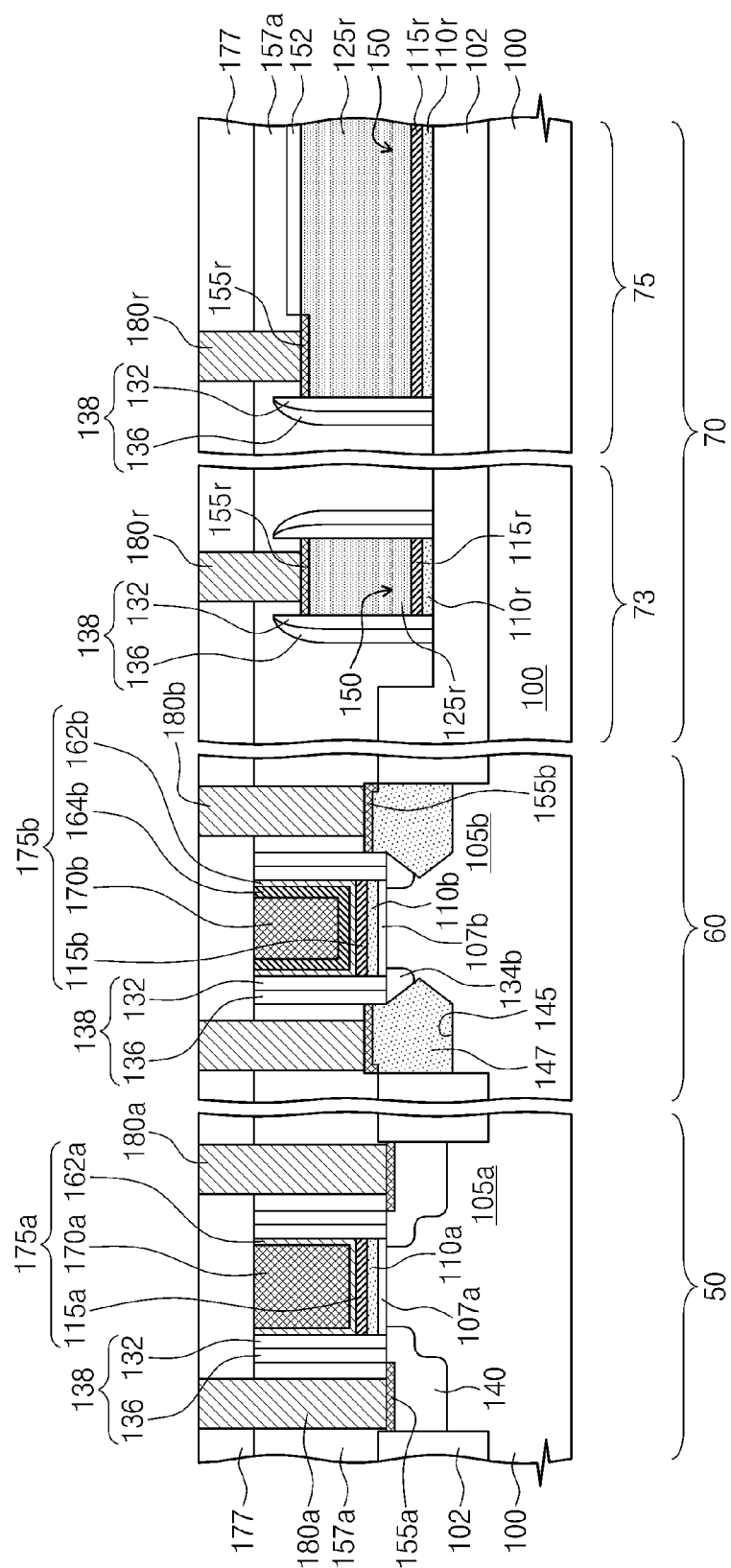
FIG. 5A is a sectional view of one example of a second embodiment of a semiconductor device according to the inventive concepts.

Another embodiment of a semiconductor device according to the inventive concept will now be described with reference to FIG. 5A.

A passive element pattern 125r is disposed on the bottom surface of a recessed portion 122 of a device isolation pattern 102 in a passive element region 70. Similarly to the first embodiment, the bottom surface of the recessed portion 122 lies in a plane beneath a plane coincident with the upper surfaces of first and second active regions 105a and 105b.

A conductive pattern remnant 115r is interposed between the passive element pattern 125r and the device isolation pattern 102 in passive element region 70, and a dielectric pattern remnant 110a is interposed between the conductive pattern remnant 115r and the device isolation layer pattern 102. The conductive pattern 115r remnant is of the same material as the second-metal containing pattern 115b in second transistor region 60. The dielectric pattern remnant 110r is of the same material as the first and second high-k dielectric patterns 110a and 110b in the first and second transistor regions 50 and 60.

In examples of this embodiment, the bottom surface of the passive element pattern 125r is disposed at a level lower than that of the bottom surfaces of the first and second gate electrodes 175a and 175b. The bottom surface of the passive element pattern 125r is disposed at a level beneath that of the top surfaces of the first and second active region 105a and 105b. The upper surface of the first interlayer dielectric layer 157a in the passive element region 70 is disposed at a level above that of the upper surface of the passive element pattern 125r. That is, the first interlayer dielectric layer 157a covers the passive element pattern 125r.

Next, another example of the second embodiment of a semiconductor device according to the inventive concepts will be described with reference to FIG. 5B.

In this example, the upper surface of a first interlayer dielectric layer 157a' is substantially coplanar with the upper surface of the passive element pattern 125r. Accordingly, the upper surface of the passive element pattern 125r is substantially coplanar with the upper surfaces of the first and second gate electrodes 175a and 175b. Additionally, upper surfaces of insulation spacers 138 on the sidewalls of the passive element pattern 125r and dummy gate patterns 175a and 175b are substantially coplanar with the upper surface of the first interlayer dielectric layer 157a'.

Next, another embodiment of a method of fabricating a semiconductor device according to the inventive concepts will be described with reference to FIGS. 6A through 6E. As has been the case throughout this written description, except for the differences described below, this embodiment and examples thereof are otherwise similar to those described above.

Figure 6A:
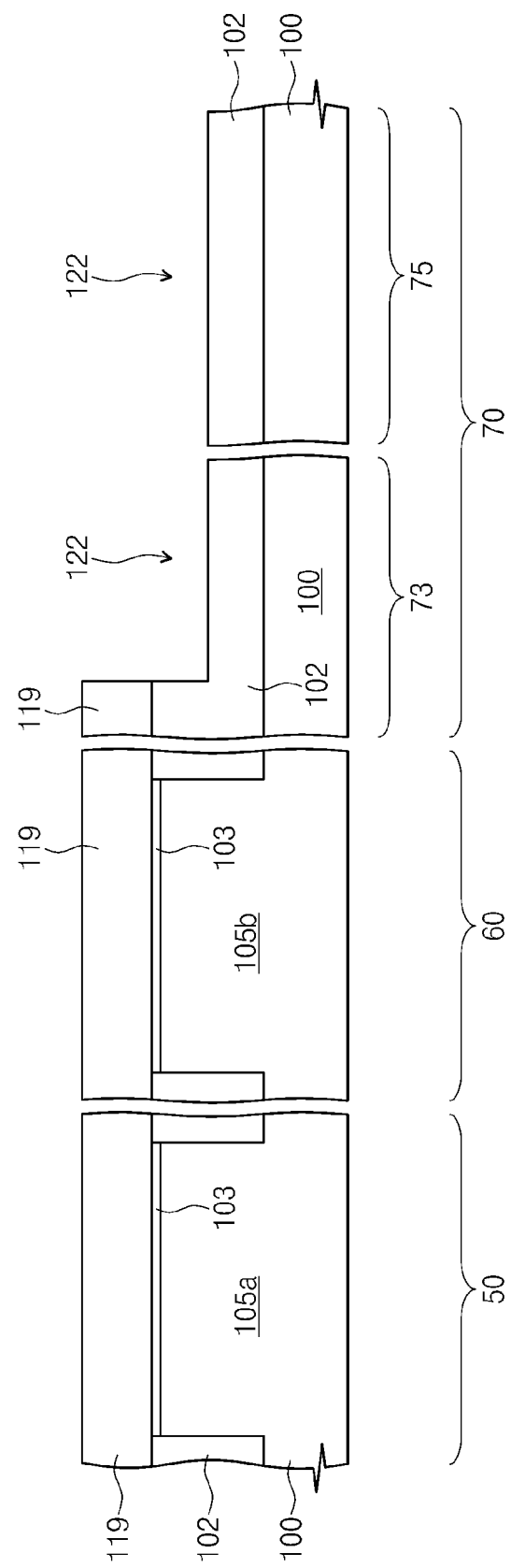
FIGS. 6A through 6E are sectional views illustrating processes of a second embodiment of a method of fabricating a semiconductor device according to the inventive concepts.

Referring to FIG. 6A, a substrate 100 having regions corresponding to a first transistor region 50, a second transistor region 60, and a passive element region 70 is prepared. In particular, a device isolation pattern 102 is formed in the substrate 100 and delimits a first active region 105a within the first transistor region 50 and a second active portion 105b within the second transistor region 60. The device isolation pattern 102 also extends in the substrate 100 in the passive element region 70. Furthermore, the first active region 105a may be doped with a dopant of a first conductivity type and the second active portion 105b may be doped with a dopant of a second conductivity type.

A buffer layer 103 is formed on the first and second active regions 105a and 105b. The buffer layer 103 may be formed by an oxidation process. A mask 119 is then formed on the substrate 100. The device isolation pattern 102 in the passive element region 70 is etched using the mask 119 as an etching mask, thereby forming a recess in the upper surface of the device isolation pattern 102, i.e., thereby forming a recessed portion 122 of the device isolation pattern 102.

Figure 6B:
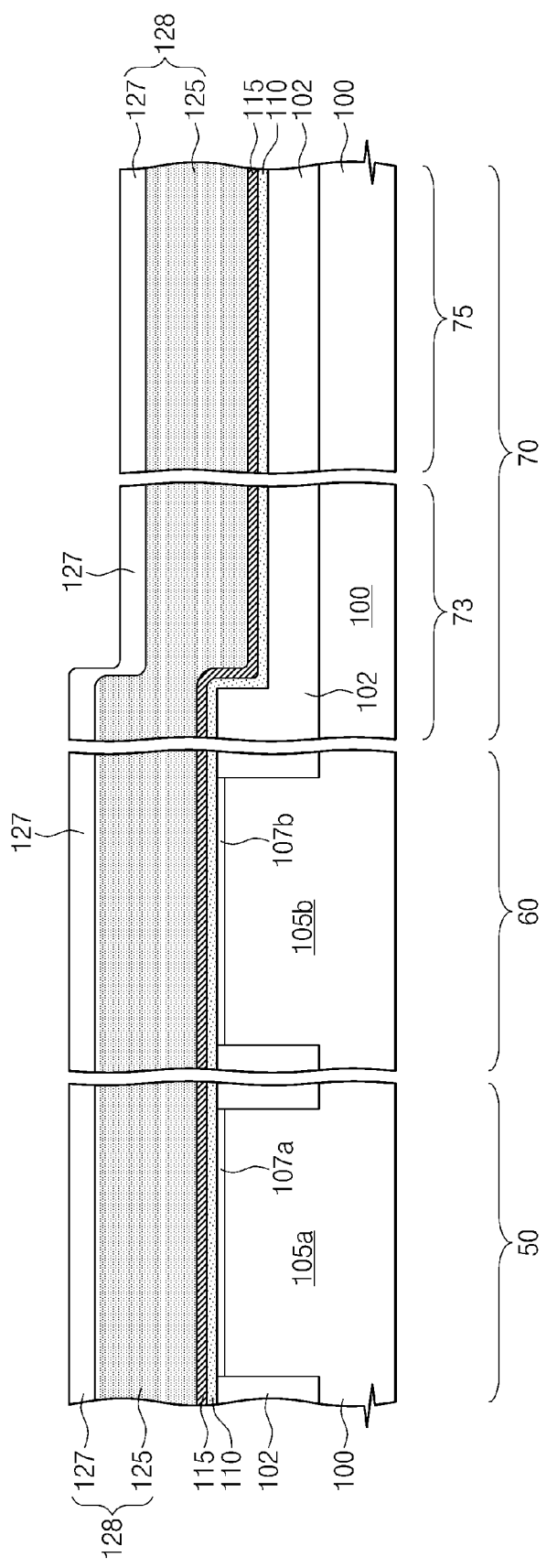

Referring to FIG. 6B, next, the mask 119 is removed. Then, a first interfacial layer 107a and a second interfacial layer 107b are formed on the first and second active regions 105a and 105b, respectively. In this respect, the first and second interfacial layers 107a and 107b may be formed by an oxidation process. Note, the buffer layer 103 may be removed before or after the first and second interfacial layers 107a and 107b have been formed.

A high-k dielectric layer 110, a metal-containing layer 115, and a dummy layer 128 are sequentially formed on the substrate 100 so as to cover the first and second interfacial layers 107a and 107b and the recessed portion 122 of the device isolation pattern 102. The dummy layer 128 may include a semiconductor layer 125, and hard mask 127 sequentially formed on the semiconductor layer 125. Alternatively, the dummy layer 128 may consist of the semiconductor layer 128. That is, the hard mask 127 may be omitted.

Figure 6C:
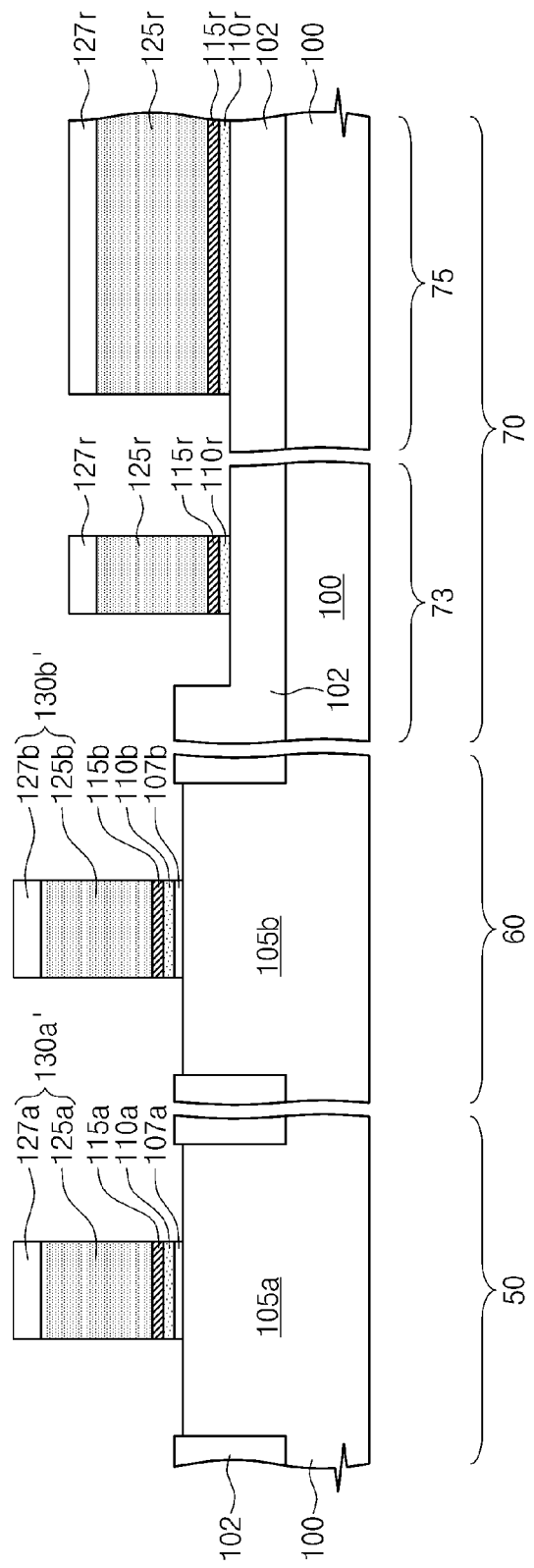

Referring to FIG. 6C, a first high-k dielectric pattern 110a, a first metal-containing pattern 115a and a first dummy gate pattern 130a' are formed by patterning the dummy layer 128, the metal containing layer 115, and the high-k dielectric layer 110 in the first transistor region 50. The first dummy gate pattern 130' may include a first dummy semiconductor pattern 125a and first dummy hard mask pattern 127a. A second high-k dielectric pattern 110b, a second metal-containing pattern 115b and a second dummy gate pattern 130b' are formed by patterning the dummy layer 128, the metal-containing layer 115, and the high-k dielectric layer 110 in the second transistor region 60. The second dummy gate pattern 130b' may include a second dummy semiconductor pattern 125b and a second dummy hard mask pattern 127b.

A dielectric pattern remnant 110r, a conductive pattern remnant 115r, a passive element pattern 125r and a capping hard mask pattern 127r are formed by patterning the dummy layer 128, the metal-containing layer 115, and the high-k dielectric layer 110 in the passive element region 70. The dielectric pattern remnant 110r is formed of a portion of the high-k dielectric layer 110, and the conductive pattern remnant 115r is formed of a portion of the metal-containing layer 115.

With respect to the sequence of these processes, the passive element pattern 125r and the dummy gate patterns 130a' and 130b' may be formed simultaneously. Alternatively, the passive element pattern 125r may be formed before or after the dummy gate patterns 130a' and 130b' have been formed.

Next, processes similar to those described with reference to FIGS. 2E through 2I are performed. Therefore, a first source/drain region 140, a second source/drain region (147 and 134b), insulation spacers 138, doped portion of passive element patterns 125r, and metal-semiconductor compound patterns 155a, 155b, and 155r are formed. Then, a first interlayer dielectric layer 157a is formed on the substrate 100.

Figure 6D:
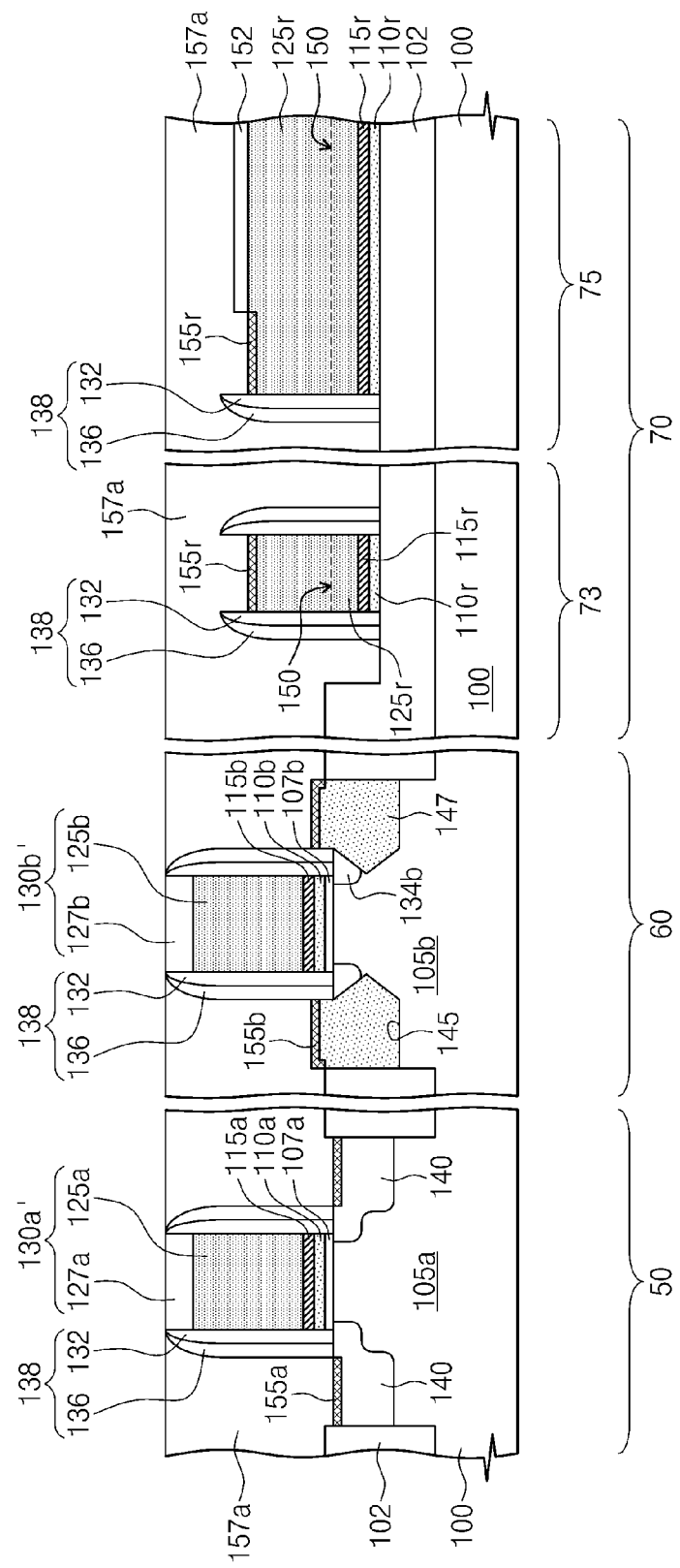

Referring to FIG. 6D, the first interlayer dielectric layer 157a is planarized until the dummy gate patterns 130a' and 130b' are exposed. During this process, the upper surface of the passive element pattern 125r is protected by the first interlayer dielectric layer 157a.

Figure 6E:
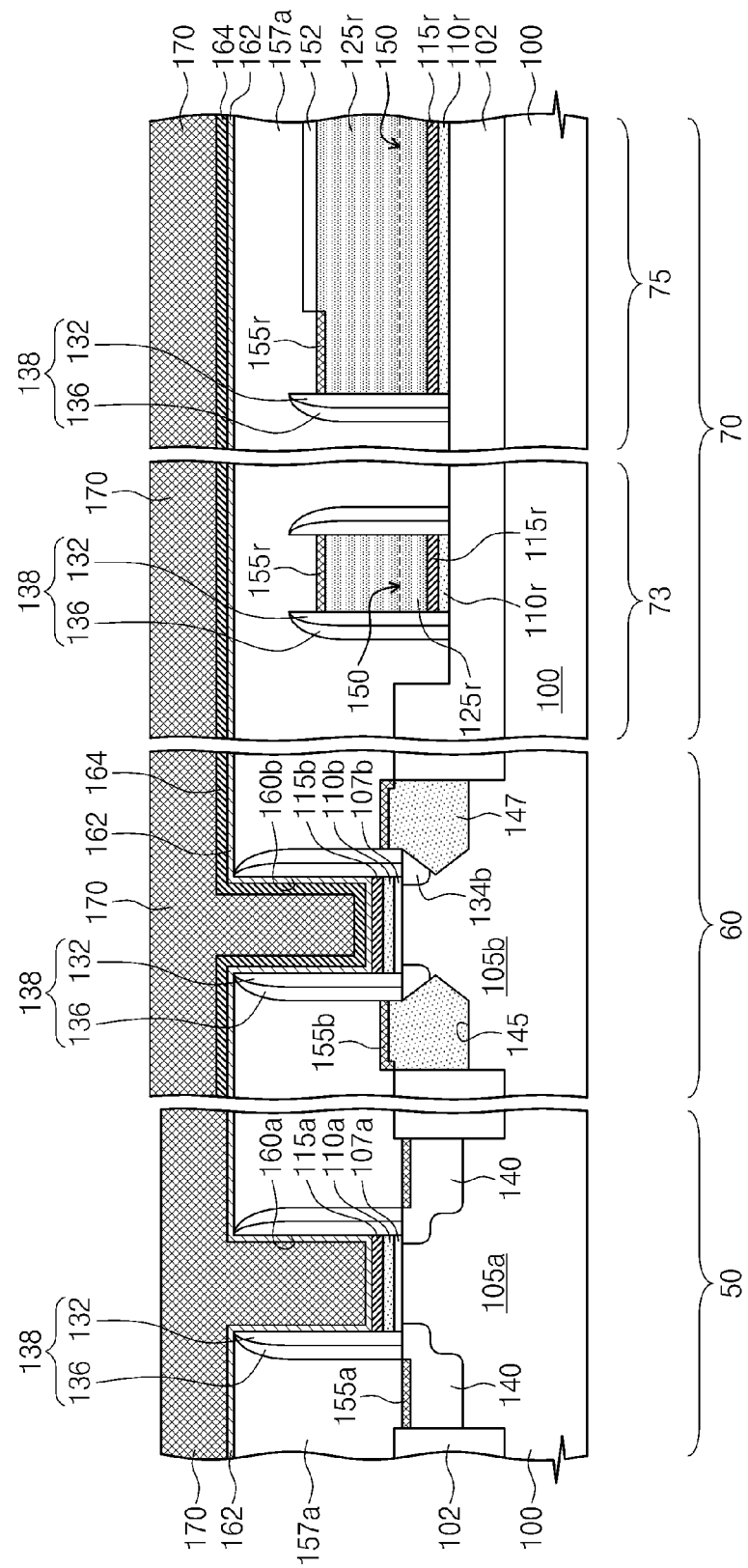

Referring to FIG. 6E, next, the first and second dummy gate patterns 130a' and 130b' are removed to form first and second openings 160a and 160b that expose the first and second metal-containing patterns 115a and 115b, respectively. Then processes similar to those described with reference to FIGS. 2K through 2M are performed to form etching barrier conductive layer 162, diffusion barrier conductive layer 164, and metal layer 170. The diffusion barrier conductive layer 164 is removed from the first transistor region 50.

The layers 170, 164, and 162 are planarized until the first interlayer dielectric layer 157a is exposed to form gate electrodes 175a and 175b. Alternatively, the layers 170, 164, and 162, the insulation spacers 138, and the first interlayer dielectric layer 157a are planarized until the passive element pattern 125r is exposed to form gate electrodes 175a and 175b. Then, a second interlayer dielectric layer 177 and contact plugs 180a, 180b, and 180r as shown in FIG. 5A or 5B are formed by conventional processes. Accordingly, semiconductor devices of the types shown in FIGS. 5A and 5B can be realized by carrying out the method.

Another embodiment of a semiconductor device according to the inventive concepts will be described in detail with reference to FIG. 7A.

Figure 7A:
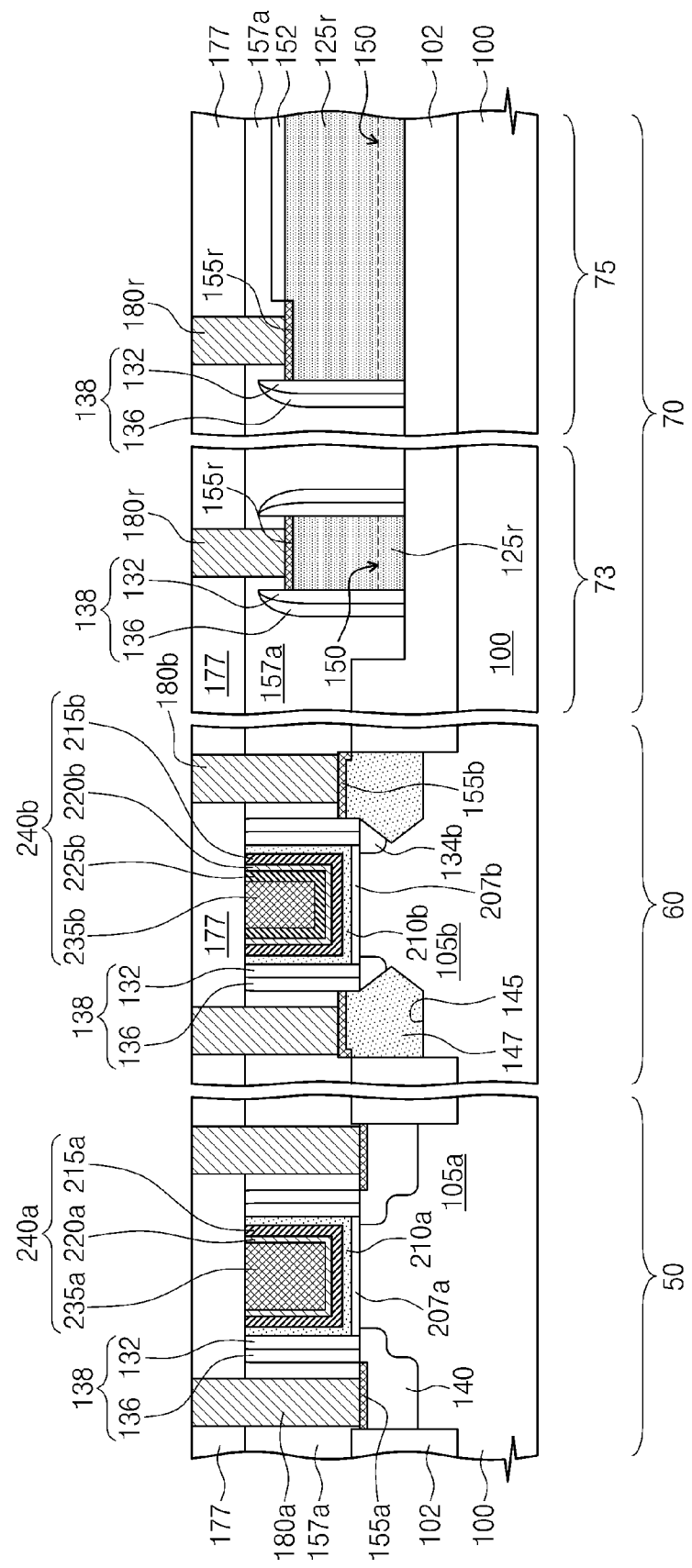
FIG. 7A is a sectional view of one example of a third embodiment of a semiconductor device according to the inventive concepts.

Referring to FIG. 7A, a first gate electrode 240a is disposed on the upper surface of first active region 105a, and first gate dielectric patterns 207a and 210a are interposed between the first gate electrode 240a and the first active region 105a. More specifically, the first gate dielectric patterns include a first interfacial layer 207a interposed between the first gate electrode 240a and the first active region 105a and a first high-k dielectric pattern 210a interposed between the first interfacial layer 107a and the first gate electrode 240a. In this example, opposite sides of the first high-k dielectric pattern 210a project upward over the opposite sides of the first gate electrode 240a, respectively. The first interfacial layer 207a, on the other hand, has a flat plate-like form.

The first gate electrode 240a includes a first metal-containing pattern 215a, a first etching barrier conductive pattern 220a and a first metal pattern 235a stacked one atop the other in the foregoing order. The first metal-containing pattern 215a is interposed between the bottom and both sidewalls of the first metal pattern 235a and the first high-k dielectric pattern 210a. Likewise, the first etching barrier conductive pattern 220a is interposed between the bottom and both sidewalls of the first metal pattern 235a and the first metal-containing pattern 210a.

A second gate electrode 240b is disposed on the upper surface of the second active portion 105b and second gate dielectric patterns 207b and 210b are interposed between the second gate electrode 240b and the second active portion 105b. The second gate dielectric pattern includes a second interfacial layer 207b interposed between the second gate electrode 240b and the second active portion 105b and a second high-k dielectric pattern 210b interposed between the second interface layer 207b and the second gate electrode 240b. Opposite sides of the second high-k dielectric pattern 210b project upward over opposite sides of the second gate electrode 240b, respectively. The second interfacial layer 207b, on the other hand, has a flat plate-like form.

The second gate electrode 240b includes a second metal-containing pattern 215b, a second etching barrier conductive pattern 220b, a diffusion barrier conductive pattern 225b and a second metal pattern 235b which are sequentially stacked one atop the other in the foregoing order. The second metal-containing pattern 215b is interposed between the bottom and sides of the second metal pattern 235b and the second high-k dielectric pattern 210b. The second etching barrier conductive pattern 220b is interposed between the bottom and sides of the second metal pattern 235b and the second metal-containing pattern 210b. The diffusion barrier conductive pattern 225b is interposed between the bottom and sides of the second metal pattern 235b and the second etching barrier conductive pattern 220b. That is, the second metal-containing pattern 215b, the second etching barrier conductive pattern 220b, and the diffusion barrier conductive pattern 225b may cover the bottom and sides of the second metal pattern 235b.

The first and second interfacial layers 207a and 207b comprise an oxide. The first and second high-k dielectric patterns 210a and 210b are formed of the same materials as those disclosed in connection with the first and second embodiments for the first and second high-k dielectric patterns 110a and 110b, respectively. The first metal-containing pattern 215a and the second metal containing pattern 215b are formed of the same materials as those disclosed in connection with the first and second embodiments for the first metal-containing pattern 115a and the second metal containing pattern 115b, respectively. Similarly, the first and second etching barrier conductive patterns 220a and 220b are formed of the same materials disclosed in connection with the first and second embodiments for the first and second etching barrier conductive patterns 162a and 162b, respectively. The diffusion barrier conductive pattern 225b is formed of the same material as that disclosed in connection with the first and second embodiments for the diffusion barrier conductive pattern 164b. The first and second metal patterns 235a and 235b are formed of the same materials as those disclosed in connection with the first and second embodiments for the first and second metal patterns 170a and 170b, respectively.

The first and second gate electrodes 240a and 240b as described above thus have different work functions. However, the inventive concept is not limited to a structure in which first and second gate electrodes are provided with different work functions through the provision of the layers and materials described above. Rather, as was mentioned above, a semiconductor device according to the inventive concept may have first and second gate electrodes provided with different work functions through the use of forms and/or materials other than those described in detail above.

In any case, passive element pattern 125r is disposed on the bottom surface of the recessed portion 122 of device isolation pattern 102 in passive element region 70, i.e., the surface of the device isolation pattern 102 that delimits the bottom of the recess in the upper surface thereof. Furthermore, the bottom surface of the recessed portion 122 lies in a plane beneath a plane coincident with the upper surfaces of the first and second active regions 105a and 105b. In this embodiment of the inventive concept, the bottom surface of the passive element pattern 125r is disposed at a level beneath that of the bottom surfaces of the first and second gate electrodes 240a and 240b, and the passive element pattern 125r is disposed directly on the bottom surface of the recessed portion 122. Thus, the bottom surface of the passive element pattern 125r is disposed at a level beneath that of the upper surfaces of the first and second active regions 105a and 105b.

A first interlayer dielectric layer 157a having a planar upper surface is disposed on the substrate 100. The first gate dielectric patterns 207a and 210a and the first gate electrode 240a are disposed in a first opening defined in the first interlayer dielectric layer 157a in the first transistor region 50, and the second gate dielectric patterns 207b and 210b and the second gate electrode 240b are disposed in a second opening defined in the first interlayer dielectric layer 157a in the second transistor region 60. The upper surfaces of the first and second gate electrodes 240a and 240b are substantially coplanar with the upper surface of the first interlayer dielectric layer 157a. Also, as shown in the figure, the upper surface of the first interlayer dielectric layer 157a lies in a plane disposed above the passive element pattern 125r, i.e., the interlayer dielectric layer 157a covers the passive element pattern 125r in the passive element region 70.

Furthermore, insulation spacers 138 may be disposed between the first interlayer dielectric layer 157a and the sidewall of the first gate electrode 240a and between the first interlayer dielectric layer 157a and the sidewall of the second gate electrode 240b, respectively.

In all other respects, the third embodiment is similar to the first and second embodiments described above.

Figure 7B:
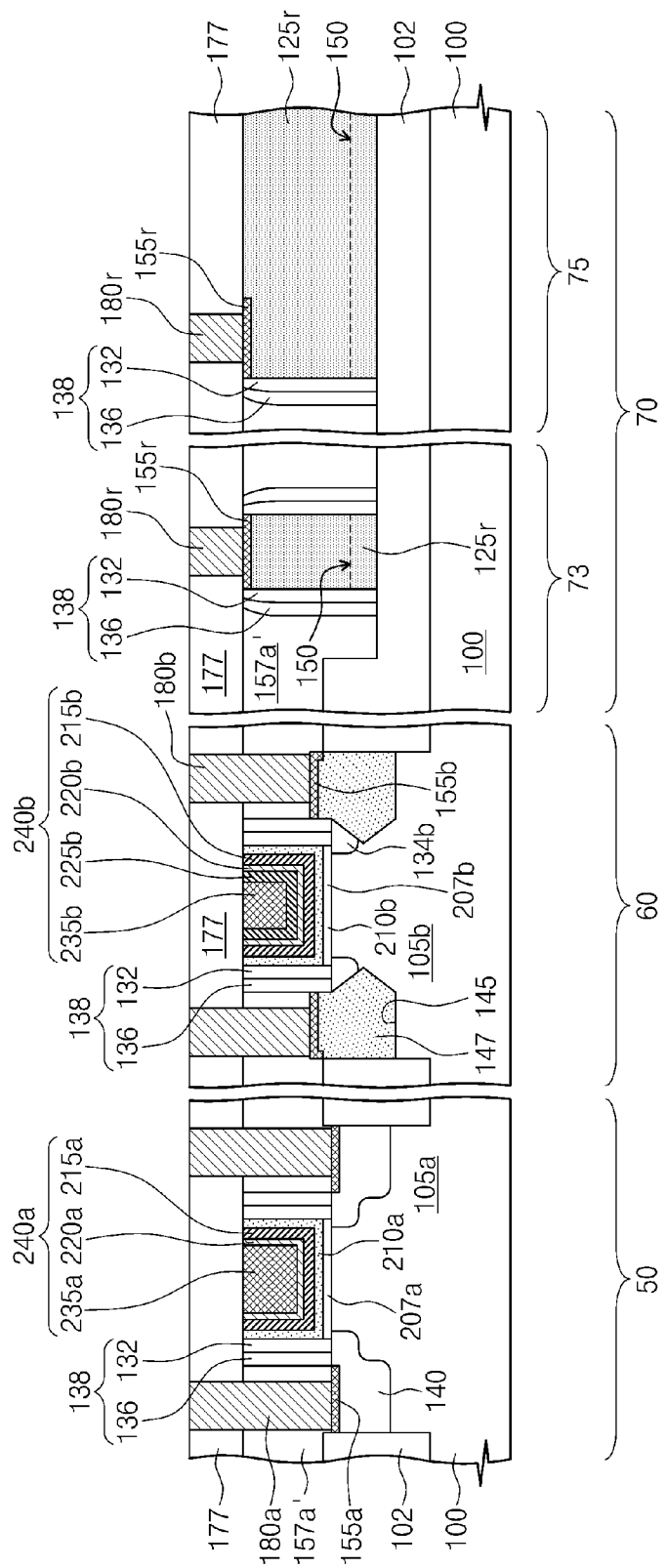
FIG. 7B is a sectional view of another example of the third embodiment of a semiconductor device according to the inventive concepts.

Another example of the third embodiment of a semiconductor device according to the inventive concepts will be described with reference to FIG. 7B.

In this example, the upper surface of a first interlayer dielectric layer 157a in the passive element region 70 is substantially coplanar with that of the passive element pattern 125r. Accordingly, the upper surface of the passive element pattern 125r is substantially coplanar with the upper surfaces of the first and second gate electrodes 240a and 240b. In all other respects, this example is similar to that described above.

A third embodiment of a method of fabricating a semiconductor device according to the inventive concepts will now be described with reference to FIGS. 8A through 8F.

Figure 8A:
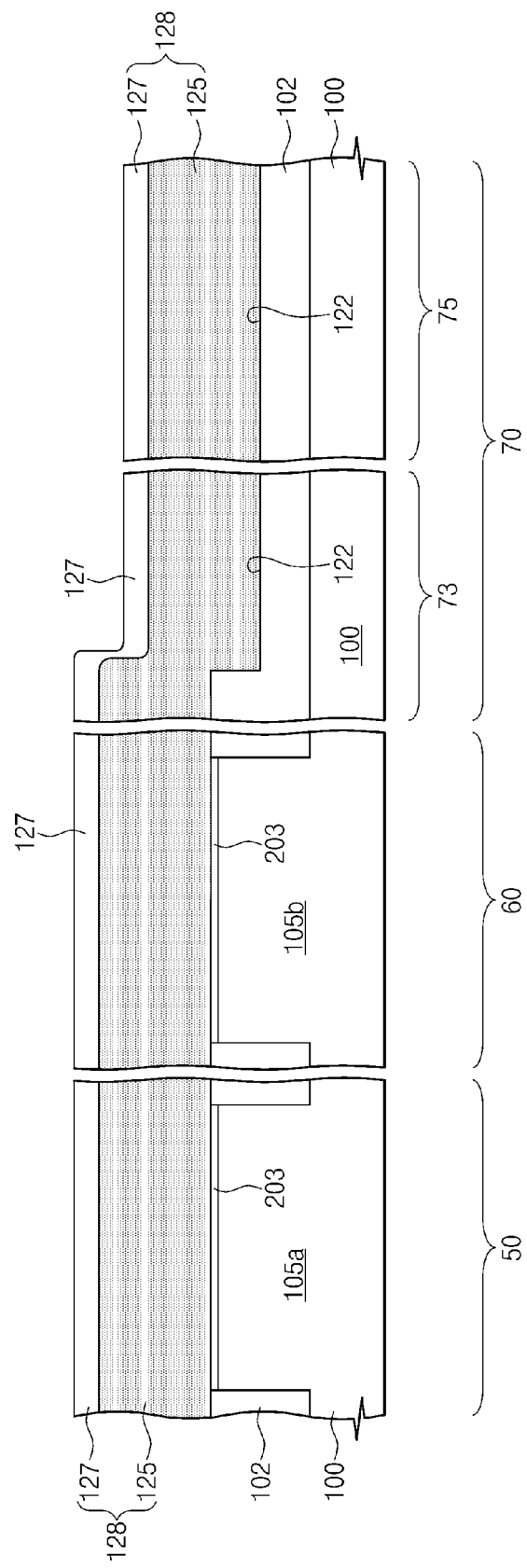

Referring to FIG. 8A, a device isolation pattern 102 is formed in a substrate 100 including in regions corresponding to first and second transistor regions 50 and 60 and a passive element region 70 of the device. The device isolation pattern 102 delimits first and second active regions 105a and 105b in the first and second transistor regions 50 and 60, respectively.

The device isolation pattern 102 is etched to form a recess in the upper surface thereof in the passive element region 70. The bottom surface of the resulting recessed portion 122 of the device isolation pattern 102 is disposed in a pane beneath a plane coincident with the upper surfaces of the first and second active regions 105a and 105b.

A buffer layer 203 is formed on the first and second active regions 105a and 105b before or after the recessed portion 122 of the device isolation layer pattern 102 is formed. The buffer layer 203 may be formed by an oxidation process.

Next, a dummy layer 128 is formed on the substrate 100.

Figure 8B:
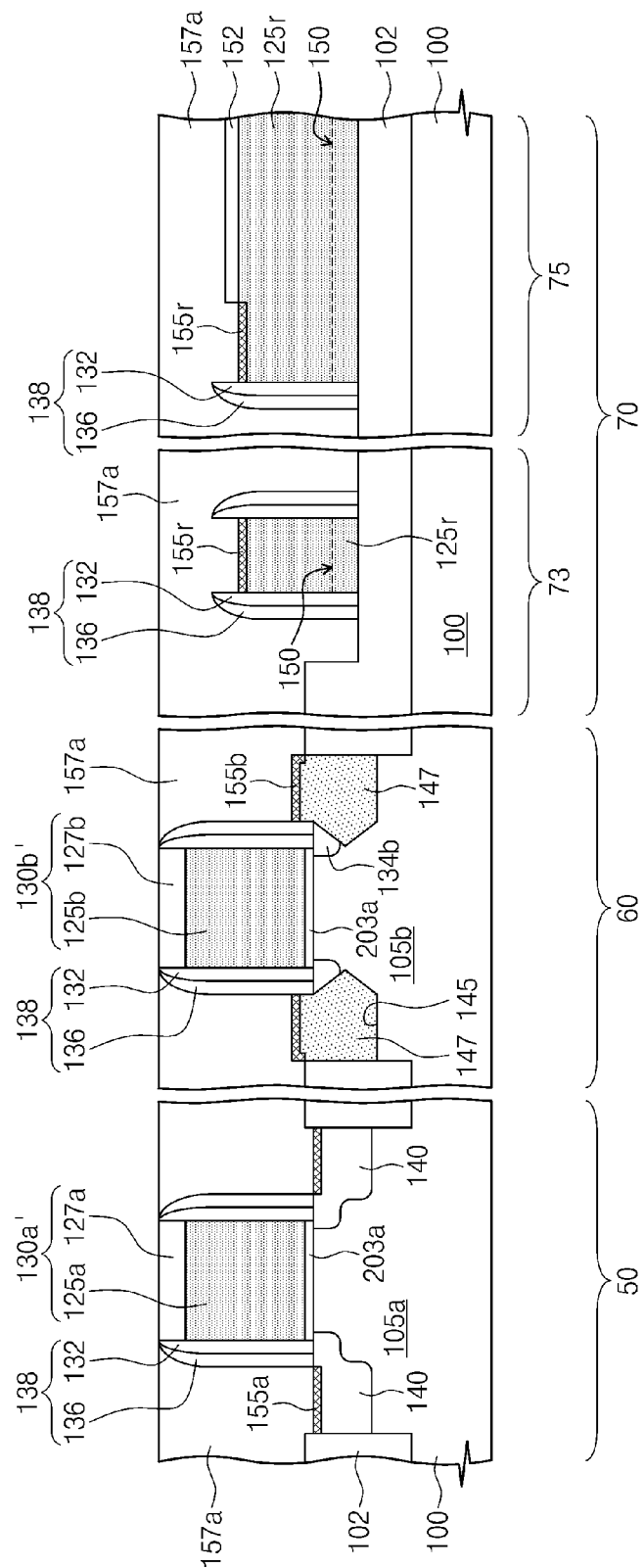

Referring to FIG. 8B, a stacked first buffer pattern 203a and first dummy gate pattern 130a' are formed by patterning the dummy layer 128 and the buffer layer 203 in the first transistor region 50. A stacked second buffer pattern 203b and second dummy gate pattern 130b' are formed by patterning the dummy layer 128 and the buffer layer 203 in the second transistor region 60. A passive element pattern 125r and capping hard mask pattern 127r (as in FIG. 2E) are formed by patterning the dummy layer 128 in the passive element region 70.

Next, processes similar to those shown in and described with reference to FIGS. 2E through 2I are performed to form the first and second source/drain regions, the insulation spacers, metal-semiconductor compound patterns and a doped passive element pattern. Furthermore, using these processes, a first interlayer dielectric layer is formed on the substrate 100, and is planarized until the dummy gate patterns 130a' and 130b' are exposed. The planarized first interlayer dielectric layer 157a covers the passive element pattern 125r.

Figure 8C:
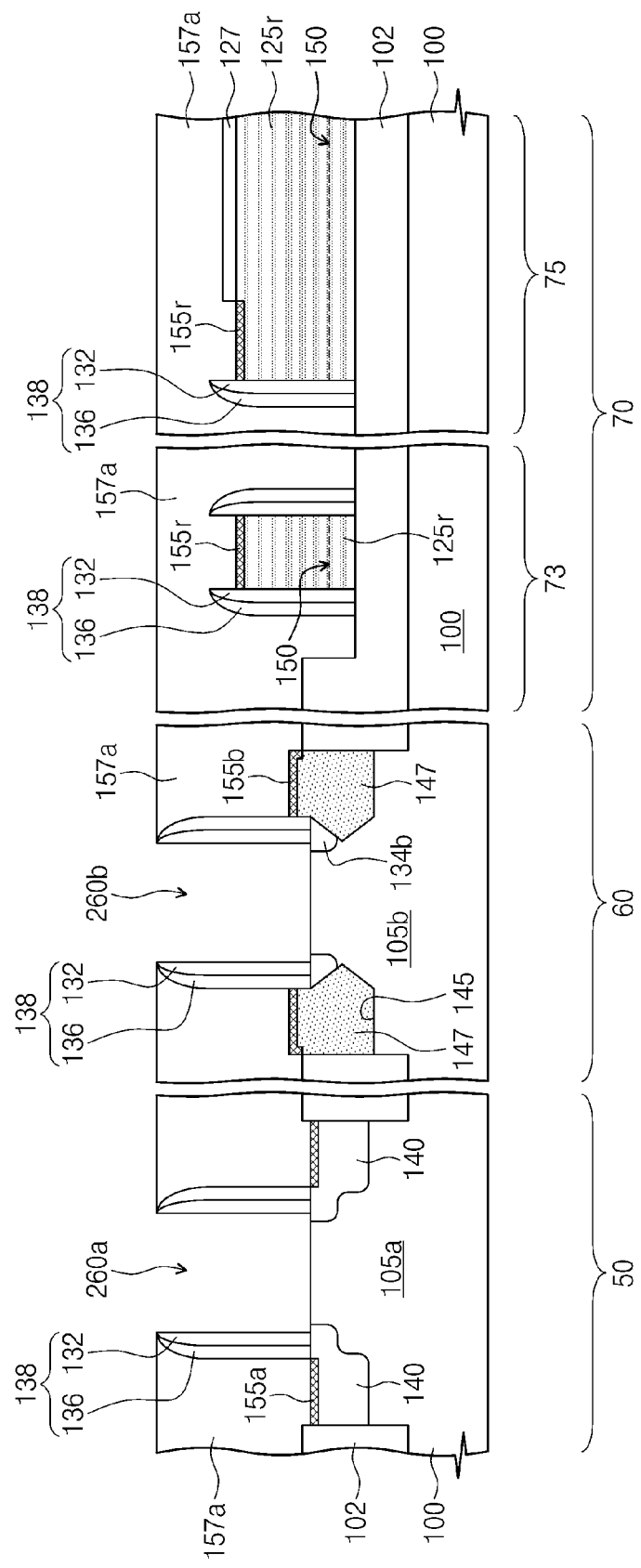

Referring to FIG. 8C, the dummy gate patterns 130a' and 130b' and the buffer patterns 203a and 203b are removed to form a first opening 260a exposing the first active region 105a in the first transistor region 50 and a second opening exposing the second active portion 105b in the second transistor region 60.

Figure 8D:
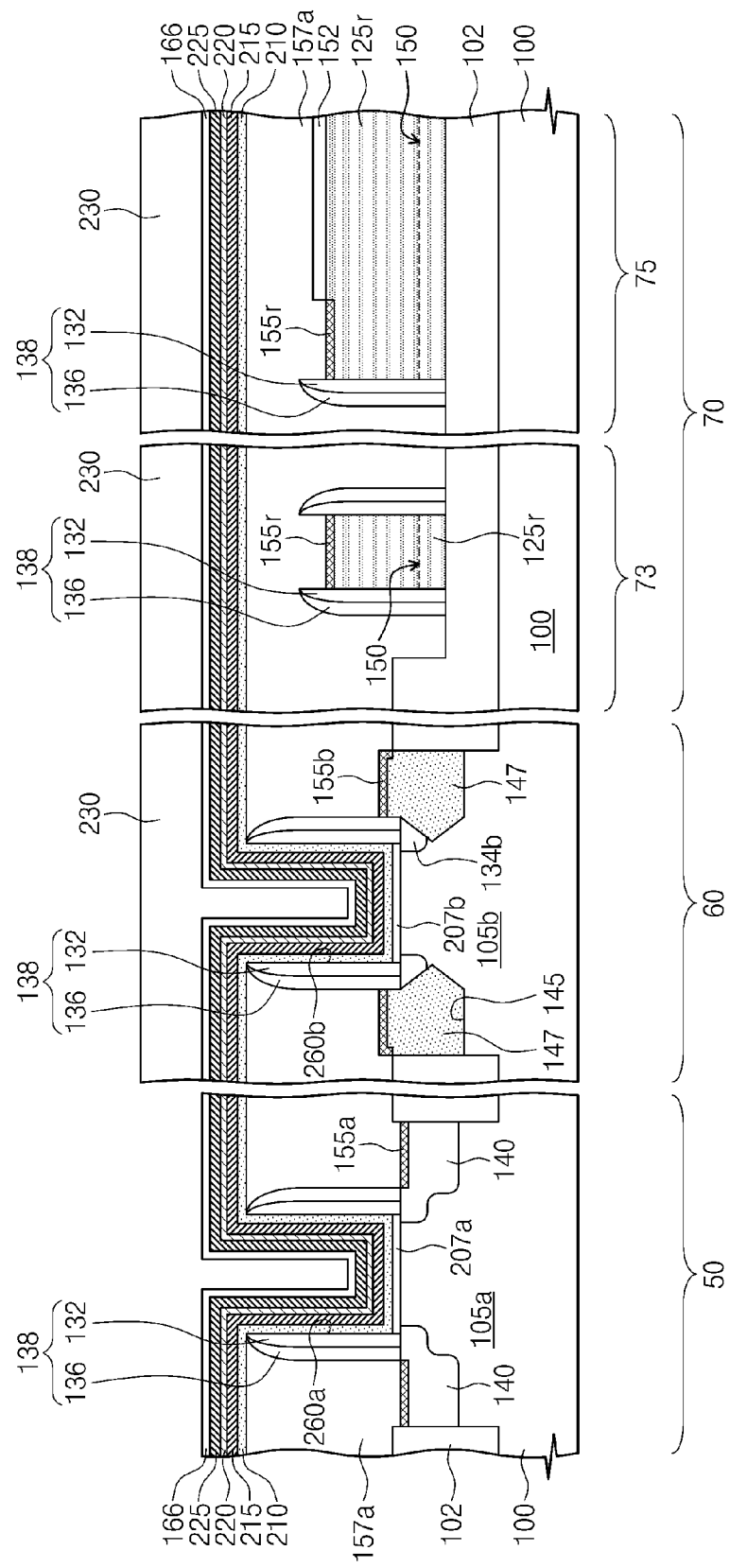

Referring to FIG. 8D, a first interfacial layer 207a is formed on that part of the first active region 105a exposed by the first opening 260a, and a second interfacial layer 207b is formed on that part of the second active region 105b exposed by the second opening 260b. The first and second interfacial layers 207a and 207b may be formed by an oxidation process. In this case, the locations at which the first and second interface layers 207a and 207b are formed are limited to those parts the first and second active portions 105a and 105b exposed by the first and second openings 260a and 260b.

Next, a high-k dielectric layer 210 is conformally formed on the substrate 100. The high-k dielectric layer 210 may have a substantially uniform thickness along the sides of the openings 260a and 260b and the interfacial layers 207a and 207b.

A metal-containing layer 215, an etching barrier conductive layer 220, and a diffusion barrier conductive layer 225 are sequentially formed on the high-k dielectric layer 210. Each of the metal-containing layer 215, the etching barrier conductive layer 220, and the diffusion barrier conductive layer 225 may be conformally formed. A blocking dielectric layer 166 is formed on the diffusion barrier conductive layer 225. Then, a mask 230 is formed on the substrate 100 to cover the blocking dielectric layer 166 and the diffusion barrier conductive layer 225 in the second transistor region 60 and leave the blocking dielectric layer 166 in the first transistor region 50 may be exposed. The mask 230 may also cover the blocking dielectric layer 166 in the passive element region 70.

Referring to FIG. 8E, the blocking dielectric layer 166 and the diffusion barrier conductive layer 225 in the first transistor region 50 are etched away using the mask 230 as an etching mask. Accordingly, the etching barrier conductive layer 220 in the first transistor region 50 is exposed.

Next, the mask 230 is removed and then the blocking dielectric layer 166 in the second transistor region 60 and the passive element region 70 is removed. Thus, the diffusion barrier conductive layer 225 in the second transistor region 60 is exposed.

Then, a metal layer 235 is formed on the substrate 100 to such a thickness as to fill the remaining portions of the first and second openings 260a and 260b.

Figure 8F:
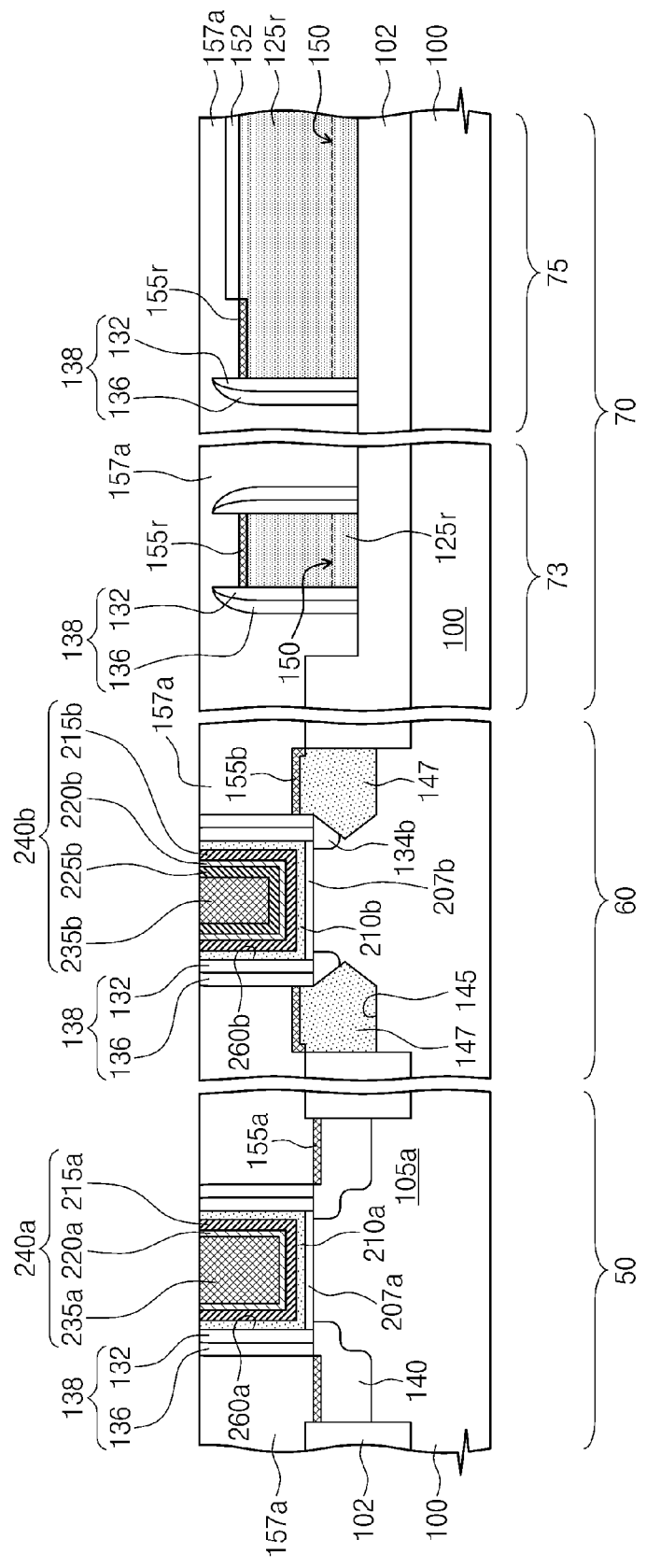

Referring to FIG. 8F, the metal layer 235, the diffusion barrier conductive layer 225, the etching barrier conductive layer 220, the metal-containing layer 215, the high-k dielectric layer 210 are planarized until the interlayer dielectric layer 157a is exposed. Therefore, a first high-k dielectric pattern 210a and a first gate electrode 240a are formed in the first opening 260a, and a second high-k dielectric pattern 210b and a second gate electrode 240b are formed in the second opening 260b. Next, the second interlayer dielectric layer 177 and contact plugs 180a, 180b, and 180r shown in and described with reference to FIG. 7A are formed using conventional processes. Alternatively, the metal layer 235, the diffusion barrier conductive layer 225, the etching barrier conductive layer 220, the metal containing layer 215, the high-k dielectric layer 210, and the first interlayer dielectric layer 157a are planarized until the passive element pattern 125r is exposed to form the high-k dielectric patterns 210a and 210b and the gate electrodes 240a and 240b in the first and second openings 260a and 260b, respectively. Then, the second interlayer dielectric layer 177 and the contact plugs 180a, 180b, and 180r shown in and described with reference to FIG. 7B are formed using conventional processes. Thus, this embodiment may be employed to produce a semiconductor device of the type shown in FIG. 7A or FIG. 7B.

Semiconductor devices as described above in accordance with the inventive concepts may be employed in various types of semiconductor packages. Examples of the types of packages that may incorporate semiconductor devices according to the inventive concept include a Package on Package (PoP), Ball Grid Arrays (BGA), Chip Scale Packages (CSP), a Plastic Leaded Chip Carrier (PLCC), a Plastic Dual In-line Package (PDIP), a Die in Waffle Pack, a Die in Wafer Form, a Chip On Board (COB) package, a Ceramic Dual In-line Package (CERDIP), a Plastic Metric Quad Flat Pack (MQFP), a Thin Quad Flat Pack (TQFP), a Small Outline Integrated Circuit (SOIC), a Shrink Small Outline Package (SSOP), a Thin Small Outline Package (TSOP), a System In Package (SIP), a Multi-Chip Package (MCP), a Wafer-level Fabricated Package (WFP), and a Wafer-level Processed Stack Package (WSP).

In addition, semiconductor devices according to the inventive concepts can be packaged along with one or more other types of semiconductor devices which perform another function so as to constitute, for example, a controller, a memory device, and/or a hybrid device.

As was described above, according to an embodiment of the inventive concepts, a passive element pattern is disposed on a surface of a device isolation pattern that is disposed at a level beneath that of the upper surface of an active region. Accordingly, the passive element pattern can be protected during the process of manufacturing the semiconductor device. For instance, the passive element pattern may be protected during the forming of openings in an interlayer dielectric layer in which gate electrodes are to be formed, such as during a process of planarizing the dielectric layer and during a process of removing dummy gate patterns from within the dielectric layer. Accordingly, semiconductor devices having favorable reliability and high degrees of integration may be realized according to the inventive concepts.

Furthermore, the passive element pattern may be formed of the dummy layer used for forming the openings in the interlayer dielectric layer, i.e., used for forming the dummy gate patterns. Accordingly, the process of manufacturing a semiconductor device can be rendered relatively simple according to the inventive concepts. Thus, the process may produce a high yield of semiconductor devices.

Finally, embodiments of the inventive concepts have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A semiconductor device, comprising:
   a substrate;
   a device isolation pattern located on the substrate and delimiting first and second active regions of the substrate, and the device isolation pattern including a recessed portion defining a recess in the device isolation pattern, the recessed portion having a bottom surface located below a plane coincident with a surface of the active regions, the bottom surface delimiting the bottom of the recess;
   first and second gate electrode structures disposed on the first and second active regions, respectively, and
   wherein the first and second gate electrode structures comprise first and second gate electrodes, respectively, first insulation spacers disposed on opposite sides of the first gate electrode, and second insulation spacers disposed on opposite sides of the second gate electrode,
   the first gate electrode includes a first etching barrier conductive pattern having a bottom extending horizontally on the first active region, and sides extending vertically over the first insulation spacers, respectively, and a first metal pattern disposed within the first etching barrier conductive pattern, the first etching barrier conductive pattern and the first metal pattern presenting an upper surface of the first gate electrode,
   the second gate electrode includes a second etching barrier conductive pattern having a bottom extending horizontally on the second gate dielectric pattern, and sides extending vertically over the first insulation spacers, respectively, and a second metal pattern disposed within the second etching barrier conductive pattern, the second etching barrier conductive pattern and the second metal pattern presenting an upper surface of the first gate electrode,
   the first and second gate electrodes have different work functions, and the first active region includes n-type impurities adjacent the sides of the first gate electrode, and the second active region includes p-type impurities adjacent sides of the second gate electrode, whereby the first and second regions respectively correspond to NMOS and PMOS regions of the device;

a passive circuit element disposed on the bottom surface of the recessed portion of the device isolation pattern so as to be situated in the recess defined by the recessed portion; and an interlayer dielectric layer on the substrate, and wherein the passive circuit element is located in a passive circuit element region of the substrate, the respective upper surfaces of the first and second gate electrodes are coplanar, the interlayer dielectric layer extends within the recess of the device isolation layer so as to occupy the recess with the passive circuit element, and the interlayer dielectric layer has a planar upper surface that extends across the active and passive circuit element regions, and is substantially coplanar with the upper surfaces of the first and second gate electrodes.

2. The semiconductor device of claim 1, wherein the upper surface of the passive circuit element is located below a plane coincident with the upper surfaces of the first and second gate electrodes.

3. The semiconductor device of claim 1, wherein the upper surface of the passive circuit element is located in a plane coincident with the upper surfaces of the first and second gate electrodes.

4. The semiconductor device of claim 1, wherein the planar upper surface of the interlayer dielectric layer is disposed above an upper surface of the passive circuit element in the passive circuit element region.

5. The semiconductor device of claim 1, wherein the passive circuit element is a resistor circuit element.

6. The semiconductor device of claim 5, wherein the resistor circuit element comprises a line of conductive material whose thickness, in a vertical direction, is greater than that of at least one of the first and second metal patterns.

7. The semiconductor device of claim 5, further comprising a gate dielectric pattern interposed between the first and second gate electrodes and the active region, and a gate dielectric pattern remnant interposed between the resistor circuit element and the bottom surface of the recessed portion of the device isolation pattern, wherein the gate dielectric pattern and the gate dielectric pattern remnant are of the same type of dielectric material.

8. The semiconductor device of claim 7, further comprising a conductive metal-containing pattern remnant interposed between the resistor circuit element and the gate dielectric pattern remnant, and wherein each of the first and second gate electrodes includes a conductive metal-containing pattern, the gate dielectric pattern is interposed between the conductive metal-containing pattern and the active regions, and the conductive metal-containing pattern remnant and the conductive metal-containing pattern include the same type of metal.

9. The semiconductor device of claim 1, further comprising a high-k dielectric pattern interposed between the first gate electrode and the first active region, and wherein the high-k dielectric pattern has opposite sides respectively self-aligned with opposite sides of the first gate electrode.

10. The semiconductor device of claim 1, further comprising a high-k dielectric pattern interposed between the second gate electrode and the second active region, and wherein the high-k dielectric pattern has vertical opposite sides extending over opposite sides of the second gate electrode, respectively.

11. The semiconductor device of claim 1, wherein the first and second etching barrier conductive patterns are of the same type of material.

12. The semiconductor device of claim 11, wherein the first and second metal patterns are of the same type of material.

13. The semiconductor device of claim 1, wherein the first and second metal patterns are of the same type of material.

14. A method of fabricating a semiconductor device, comprising:

forming a device isolation pattern on a substrate, wherein the device isolation pattern delimits an active region of the substrate;

forming a dielectric layer, a metal-containing layer, and a protective layer sequentially over both the active region and the device isolation pattern;

forming an etch mask which covers a first part of the protective layer extending over both the active region and a first portion of the device isolation pattern adjacent the active region and which exposes a second part of the protective layer extending over another portion of the device isolation pattern, and etching the second part of the protective layer exposed by the etch mask, respective portions of the dielectric layer and the metal-containing layer under the second part of the protective layer, and an upper portion of the second part of the device isolation pattern to form a recess in the device isolation pattern such that a bottom surface of a recessed portion of the device isolation pattern, defining the bottom of the recess, is located below a plane coincident with an upper surface of the active region; and forming a passive circuit element on the bottom surface of the recessed portion of the device isolation pattern such that the passive circuit element is situated in the recess.

15. The method of claim 14, further comprising:

removing the etch mask to expose the first part of the protective layer after the device isolation pattern has been etched to form the recess, and depositing a layer of semiconductor material over the first part of the protective layer and within the recess of the device isolation pattern.

16. The method of claim 15, wherein the forming of the passive circuit element comprises patterning the layer of semiconductor material.

17. The method of claim 16, wherein the patterning of the semiconductor layer comprises forming a sacrificial gate electrode pattern on the active region.

18. The method of claim 16, wherein the patterned semiconductor layer defines at least a portion of a resistor circuit element.

* * * * *